US006866793B2

(12) United States Patent
Singh

(10) Patent No.: US 6,866,793 B2
(45) Date of Patent: *Mar. 15, 2005

(54) HIGH SELECTIVITY AND HIGH PLANARITY DIELECTRIC POLISHING

(75) Inventor: Rajiv K. Singh, Gainesville, FL (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/255,493

(22) Filed: Sep. 26, 2002

(65) Prior Publication Data

US 2004/0060502 A1 Apr. 1, 2004

(51) Int. Cl.[7] .................... C09K 13/00; C09K 13/04; H01L 21/302
(52) U.S. Cl. .................. 252/79.1; 252/79.4; 438/692
(58) Field of Search .................. 252/79.1, 79.4; 438/692; 510/176

(56) References Cited

U.S. PATENT DOCUMENTS

| | | | | |
|---|---|---|---|---|
| 5,938,505 | A | | 8/1999 | Morrison et al. ............. 451/36 |
| 6,063,306 | A | * | 5/2000 | Kaufman et al. ........... 252/79.4 |
| 6,120,571 | A | * | 9/2000 | Aihara et al. ................. 51/309 |
| 6,258,137 | B1 | * | 7/2001 | Garg et al. .................... 51/298 |
| 6,258,205 | B1 | | 7/2001 | Chisholm et al. ...... 156/346.16 |
| 6,372,632 | B1 | | 4/2002 | Yu et al. ..................... 438/634 |
| 6,383,888 | B1 | * | 5/2002 | Stirton ....................... 438/401 |
| 6,409,936 | B1 | | 6/2002 | Robinson et al. .......... 252/79.1 |

OTHER PUBLICATIONS

Stöber, et al. "Controlled Growth of Monodisperse Silica Spheres in the Micron Size Range," Journal of Colloid and Interface Science, 26:62–69, 1968.
Rosen, M., "Surfactants and Interfacial Phenomena," Second Edition, 1998, pp. 3–32, 52–54, 72–80, 122–132, and 388–401.

* cited by examiner

Primary Examiner—Lan Vinh
Assistant Examiner—Lynette T. Umez-Eronini
(74) Attorney, Agent, or Firm—Akerman Senterfitt

(57) ABSTRACT

A slurry includes a plurality of particles and at least one selective adsorption additive. The particles are preferably composite particles including a core surrounded by a shell provided by the selective adsorption additive. The slurry can be used to polish a structure including silicon dioxide or a low K dielectric film and a silicon nitride containing film, such as to form a shallow trench isolation (STI) structure or a metal-dielectric structure. The silicon nitride containing film surface substantially adsorbs the selective adsorption additive, whereas the silicon dioxide or low K dielectric film shows non-substantial adsorption characteristics to the adsorption additive. In another embodiment of the invention, silicon dioxide or low K dielectric film shows non-substantial adsorption of the selective adsorption additive at a pressure above a predetermined first pressure, and substantial adsorption of the selective adsorption additive for pressures below a predetermined second pressure, where the first pressure is greater than the second pressure.

42 Claims, 26 Drawing Sheets

| Particle size (nm) | Additive | Conc. Of additive (mM) | Removal rate (A/min) | Adsorption ratio of $Si_3N_4$ |
|---|---|---|---|---|
| 80 | SDS | 8 | 30 | 20.0 |
| | | 32 | 16 | 50.8 |
| | | 200 | 8 | 75.0 |
| | $C_{12}TAB$ | 32 | 152 | 9.2 |
| | DapralGE202 | 32 | 45 | 47.0 |
| 500 | SDS | 32 | 27 | 45.1 |
| | DapralGE202 | 32 | 86 | 42.5 |
| 1000 | SDS | 32 | 72 | 36.4 |
| | DapralGE202 | 32 | 97 | 37.4 |
| 2000 | SDS | 32 | 142 | 32.6 |
| | DapralGE202 | 32 | 186 | 32.6 |

FIG. 15

| Particle | Size (nm) | Solid loading (wt.%) | Additive | Adsorption ratio of $Si_3N_4$ |
|---|---|---|---|---|
| Silicon Dioxide | 500 | 2 | 5 mM SDS | 15 |
|  |  |  | 100 mM SDS | 50 |
|  | 50 | 5 | 128 mM SDS | 45 |
| Nanoporous Silicon Dioxide | 100 | 2 | 128 mM SDS | 46 |
| $SiO_2/Al_2O_3$ | 500 | 2 | 128 mM SDS | 65 |
| $CeO_2/SiO_2$ | 500 | 2 | 128 mM SDS | 20 |
| $MnO_2/SiO_2$ | 300 | 2 | 128 mM SDS | 36 |
| $TiO_2/SiO_2$ | 300 | 2 | 128 mM SDS | 42 |

FIG. 16

| Particle | Additive | Slurry pH | Adsorption ratio of $Si_3N_4$ |
|---|---|---|---|
| 80 nm $Si_3N_4$ | Dapral GE202 | 2 | 32 |
| | | 3 | 50 |
| | | 7 | 40 |
| | | 11 | 36 |
| | | 13 | 38 |

FIG. 17

| Particle | Mixed Additive | AR of Silicon nitride |
|---|---|---|
| 200 nm $SiO_2$ | SDS/SAS/$C_{12}$TAC/$C_{12}$TAB/$NH_4NO_3$ | 37 – 120 |
| | SDS/PEO | 65 – 100 |
| | ALS/$C_{12}$TAB/TX-100/Dapral GE202 | 74 - 120 |

FIG. 18

| Particle | Size (nm) | Solid loading (wt.%) | Additive | Adsorption ratio of silicon dioxide | Adsorption ratio of low k |
|---|---|---|---|---|---|
| Silicon nitride | 80 | 2 | 64 mM $C_{10}$TAB | 40 | 37 |
| | | 5 | 64 mM $C_{12}$TAB | 70 | 32 |
| | 500 | 2 | 32 mM $C_{10}$TAB | 32 | 34 |
| Silicon Dioxide | 20 | 2 | 100 mM $C_{12}$TAB | 50 | 67 |
| | 100 | 5 | 100 mM $C_{12}$TAB | 48 | 58 |
| Ceria/$SiO_2$ | 200 | 2 | 100 mM $C_{12}$TAB | 30 | 34 |
| $MnO_2$/$SiO_2$ | 300 | 2 | 100 mM $C_{12}$TAB | 24 | 36 |
| $TiO_2$/$SiO_2$ | 300 | 2 | 100 mM $C_{12}$TAB | 32 | 32 |
| $SiO_2$/$Al_2O_3$ | 500 | 2 | 100 mM $C_{12}$TAB | 42 | 28 |
| Nanoporous $SiO_2$ | 100 | 5 | 100 mM $C_{12}$TAB | 85 | 67 |

FIG. 19

| Particle | Size (nm) | Solid loading (wt.%) | Additive | Adsorption ratio of silicon dioxide | Adsorption ratio of low k |
|---|---|---|---|---|---|
| Silicon nitride | 80 | 2 | SDS/$C_{12}$TAB/ALS/PEO/$C_{10}$TAB | 1.5 - 25.0 | 2.5 - 30 |
| Silicon Dioxide | 20 | 2 | SDS/$C_{12}$TAB/ALS/PEO/$C_{10}$TAB | 2.0 - 60 | 35 - 65 |
| | 100 | 5 | SDS/$C_{12}$TAB/ALS/PEO/$C_{10}$TAB | 1.5 - 45 | 25 - 45 |

FIG. 20

| Particle | pH | Additive | AR of silicon dioxide |
|---|---|---|---|
| Silicon Dioxide | 2 | 2 mM $C_{12}$TAB | 1.5 |
| | | 128 mM $C_{12}$TAB | 156 |
| | 13 | 2 mM $C_{12}$TAB | 2.0 |
| | | 128 mM $C_{12}$TAB | 220 |

FIG. 21

| Particle | Additive | Pressure (Psi) | AR of silicon dioxide |
|---|---|---|---|
| Silicon Dioxide | $C_{10}$TAB/SDS | 2.0 | 1.5 – 45.3 |
| | | 12.4 | 1.6 – 10.4 |
| | ALS/$C_{12}$TAB/Tween 80/TX-100 | 2.0 | 1.4 – 13.6 |
| Nanoporous $SiO_2$ | ALS/Pyridinium/TX-100 | 6.7 | 1.8 – 15.7 |

FIG. 22

| Particle | Size (nm) | Additive | SAR ($Si_3N_4/SiO_2$) | Selectivity |
|---|---|---|---|---|
| Silicon nitride | 80 | ALS | 15.6 | 46.4 |
| | | Dapral / TX-100/ Tween 80 | 18 – 43 | 54 - 126 |
| Silicon Dioxide | 50 | SDS / $C_{12}$TAB / PEO /$NH_4NO_3$ | 0.58 - 88 | 1.45 - 268 |
| Nanoporous Silicon Dioxide | 300 | ALS / $C_{12}$TAB | 3.3 -83 | 10 - 250 |

FIG. 23

| Particle | Additive | pH | SAR ($Si_3N_4/SiO_2$) | Selectivity |
|---|---|---|---|---|
| Silicon nitride | SDS | 2 | 120 | 355 |
| | | 7 | 52 | 150 |
| | | 11 | 23 | 66 |

FIG. 24

| Particle | Additive | Low Pressure (P1) (Psi) | High Pressure (P2) (Psi) | RR at P1 (A/min) | RR at P2 (A/min) | NPPR |
|---|---|---|---|---|---|---|
| Alumina | SDS / $C_{12}$TAB | 4.8 | 11.8 | 40 | 250 | 2.51 |
| Silicon nitride | SDS / $C_{12}$TAB / TX-100 | 2.7 | 6.7 | 2500 | 10000 | 1.6 |
| Silicon Dioxide | PAA | 2.7 | 4.5 | 46 | 230 | 3.0 |
| | $C_{10}$TAB/ $C_{12}$TAB / PEO / TX-100 / ALS / SDS | 5.2 | 13.2 | 100 - 400 | 300 - 1400 | 1.2 - 4.2 |

HIGH SELECTIVITY AND HIGH PLANARITY DIELECTRIC POLISHING

STATEMENT REGARDING FEDERALLY SPONSORED RESEARCH OR DEVELOPMENT

Not applicable.

FIELD OF THE INVENTION

This invention relates to a slurry and method for chemical-mechanical polishing (CMP) of dielectrics. The slurry can be used in a chemical mechanical planarization step for integrated shallow trench isolation (STI) processes, chip interconnect dielectric planarization, or a variety of dielectric planarization processes.

BACKGROUND

Reductions in semiconductor device dimensions provide higher densities and improved performance for integrated circuits. In many integrated electronic devices, millions of discrete elements, such as transistors, resistors and capacitors are built in close proximity and integrated onto a single device. The combined layers of neighboring devices can form parasitic devices. Thus, one of the important initial steps in the fabrication of semiconductor devices is to electrically isolate adjacent electronic devices on a common substrate.

Isolation structures are generally formed using the local oxidation of silicon (LOCOS) isolation process. One disadvantage of the LOCOS process is that the silicon dioxide (isolation layer) grows in an isotropic manner resulting in consumption of the surface area of the semiconductor substrate and causes adjacent electronic devices that are isolated from one another to be a fixed minimum distance apart. This limits the maximum density of the electronic devices on each microchip. Additionally, the oxidation of the silicon surface can lead to large stresses in the device area (e.g. bird's beak), which may not be conducive for higher levels on integration demanded by each generation of devices.

Another technique which can be used in creation of isolation structures is referred to as the shallow trench isolation (STI) process. FIGS. 1(a) and (b) show layer configurations before and after CMP in a conventional STI process, respectively. To form the structure immediately before CMP shown in FIG. 1(a), a thin pad oxide 106 is first grown on a semiconductor 105 after which a thin silicon nitride layer 110 is deposited on the pad oxide. The pad oxide 106 and the nitride 110 are then etched to define the area of the isolation structure, including width 102, the width 102 typically being 1 to 100 $\mu$m. Next, the semiconductor substrate (e.g. silicon) is anisotropically etched to form a trench in the substrate 105 within the area defined including width 102.

The trench is then filled with deposited silicon dioxide or other dielectric 120 to a height above that of the silicon nitride surface (FIG. 1(a)). The deposited silicon dioxide has a very rough surface topography because the size and the density of the trenches vary within the die. To make the final STI structure, the deposited silicon dioxide is polished off using CMP to produce a substantially planar surface (FIG. 1(b)).

CMP combines both chemical action and mechanical forces and is commonly used to remove metal and dielectric overlayers in damascene processes, remove excess oxide in shallow trench isolation (STI) steps, and to reduce topography across a dielectric region. Components required for CMP include a chemically reactive liquid medium and a polishing surface to provide the mechanical control required to achieve planarity. The slurry may contain nanosize to microsize inorganic particles to enhance the reactivity and mechanical activity of the process.

Typically in case of dielectric polishing, the surface may be softened by the chemical action of the slurry, and then removed by the action of the particles. CMP is the only technique currently known for producing die level flatness required for sub 0.5 $\mu$m devices and is considered a requirement for the production of sub 0.2 $\mu$m shallow device isolation structures and state-of-the-art metal interconnect schemes.

A diagram of a conventional CMP polisher 200 is shown in FIG. 2. The CMP polisher includes a polishing pad 210 disposed on a platen 220 which rotates. A wafer 230 is pressed into direct contact with the polishing pad by a force exerting structure 250. A slurry solution is provided by the slurry feed 240 to wet the polishing pad 210 which chemically and physically interacts with the surface of the wafer 230.

Conventional slurries used for oxide CMP include a plurality of solid abrasive particles, such as silica or ceria. In FIG. 2, the polishing pad 210 is shown attached to the top of the rotating platen 220, while the wafer 230 is brought in contact with the pad 210 from the top. The wafer 230 can either be rotated or kept stationary. The wafer 230 can be moved in a circular, elliptical or in a linear manner with respect to the polishing pad 210. The pressure on the wafer 230 is generally varied from 0.1 Psi to 10 Psi, and the rotation speed of the platen 220 is generally varied from 5 rpm to 300 rpm.

The polymeric pad 210 transports the slurry below the wafer surface and participates in the wafer-particle pad interaction to remove the surface layers from the wafer. Typical pads which are commonly used include IC1000 CMP pads manufactured by Rodel Corporation, Newark, Del.

The diameter of the platen wheels 220 can vary from 10 inches to 45 inches, while the size of the wafer can vary from 1 inch to 12 inches in diameter. To maintain a fixed linear velocity, either the angular velocity can be increased or the radius of the wafer from the center can be increased.

During deposition of silicon dioxide for STI formation, the surface morphology of the silicon dioxide can be extremely rough because of the wide variation in the pattern density and dimensions of the trenches. For example, the dimensions of the trenches can vary from less than 0.1 $\mu$m to 1 mm, while the spacing between the trenches can also vary by about the same amount. Additionally the density of the patterns, which is defined as the ratio of the trench area to the total area, can vary from as low as 1% to nearly 100%. These wide variations in the size, spacing, and the density of the trenches generally lead to very wide variations in the surface morphology of the silicon dioxide or other dielectric filler material to be polished.

Because of the widely varying surface morphologies across the wafer, it is difficult to use a direct CMP process to remove the overburden of silicon dioxide from the surface of a patterned STI wafer. The CMP polishing rates generally have to be determined to be a function of pattern density of the trenches, its width, and pitch spacing and as well as its location within the wafer. Thus, a direct CMP process using conventional silica based slurries will cause higher removal rate in regions where the density of the trenches is high, compared to regions which have relatively large open areas, or regions with a low density of trenches. This effect can cause damage to the thin high-density isolated regions of trenches, while sometimes not removing the oxide in the less dense regions of the substrate. Damage occurs in isolated regions because the oxide in the area with a large percentage of trenches polishes at a much higher rate than the oxide over the nitride. CMP induced damage can cause silicon defects which can significantly increase junction leakage and make the wafer unsuitable for production.

To avoid damaging the substrate during STI polishing and to reduce the non-uniformity of the oxide polishing, some methods have been developed. In one method, silicon dioxide deposited in the trenches is reverse patterned and etched before the surface is planarized by the CMP process. A reverse pattern refers to the pattern which is inverse of the standard trench pattern which was used initially to etch to make the trenches within silicon substrate. The reverse pattern step makes the density of the silicon dioxide surface uniform across the die and the wafer. Thus, during the CMP process the removal of the silicon oxide is quite uniform and a relatively planar surface may be obtained following the CMP process.

Once the planar removal of the oxide layer is accomplished using standard silica slurries which typically operate in alkaline environments, the CMP process can generally be stopped at the underlying silicon nitride layer. The nitride layer typically has a polishing selectivity of less than 5:1 when compared to silicon dioxide polishing. The low removal rate of silicon nitride compared to silicon dioxide is sufficient to stop the CMP process before significant removal of the nitride overlayer takes place and damage occurs.

However, the reverse etch process followed by CMP has many disadvantages. Typically, this process requires an extra lithographic step which generally includes resist coating, mask exposure, resist development, silicon dioxide etching, and post photo clean steps. Accordingly, the extra lithographic step increases cycle time, increases the cost of manufacturing, and adds defect density. Thus, there is a need to develop a STI process which does not require added processing, such as a reverse etch step before the CMP process.

One method to eliminate the reverse etch step which would permit a direct STI process would be a CMP slurry which provides a high selectivity for polishing silicon dioxide compared to the underlying silicon nitride layer. If high silicon dioxide to silicon nitride selectivity could be achieved, then the polishing will effectively stop upon reaching the silicon nitride underlying layer. Thus, damage to the nitride coated isolated regions, which will later comprise active device areas, will not occur.

Several attempts have been made to develop slurries which exhibit a high removal rate of silicon dioxide compared to silicon nitride. U.S. Pat. No. 5,938,505 to Morrison et al. discloses adding tetramethyl ammonium hydroxide (TMAH), hydrogen peroxide and other additives to a silicon dioxide slurry to increase the selectivity of the polishing process to as high as 30:1. The high selectivity condition typically occurs when polishing is performed in highly alkaline environments, such as a pH from 11 to 13.

Although there is an increase in selectivity, this increase in selectivity is not high enough to eliminate the non-uniformity problems in pattern dependent silicon dioxide polishing. Additionally TMAH has been known to have stability problems and degrades to trimethyl amines which may lead to the breakdown in the slurry performance with time. Because of the breakdown problem, the slurry generally needs to be used almost immediately after it is prepared.

Another method for increasing the selectivity of silicon dioxide to silicon nitride polishing is to use ceria based slurries which include specific additives, such as L-proline. Selectivity of polishing rates of greater than 100 have been reported using ceria based slurries. The selectivity of these ceria based formulations generally permits completely stopping at the nitride layer which leads to small deviations in the silicon nitride left after completion of the CMP polishing process.

However, other factors are of concern when cerium oxide based slurries are used. First, cerium oxide is a high density material and is susceptible to settling, thus leading to adhesion and scratching of the dielectric surface layer. This can lead to an increase in defectivity. Second, the additives used in ceria based slurries used to increase the oxide to nitride selectivity destabilize the ceria based slurries and make them more susceptible to settling and large variations in polishing performance as a function of time. Third, these slurries also have to be mixed at the point of use, thus making the process more cumbersome. Finally, the chemical added to increase the selectivity of oxide to nitride polishing may not still increase the planarity of the polishing process. The high selectivity slurries need to be highly planar, which requires the polishing rate for the top area to be much higher than the bottom area. Otherwise even with high selectivity, the silicon dioxide trenches can have depressed regions (or dishing) which lead to non-planarity of the surface.

Low dielectric constant materials, referred to herein as "low K dielectrics", are materials with dielectric constants less than about 3.5, such as fluorine, carbon, and/or nitrogen doped silica, nanoporous materials, and polymeric materials such as SiLK (manufactured by Dow Chemicals). Low K materials are also used as a low K dielectric in the metallization of the semiconductor devices. These low K dielectric materials can either be used with patterned aluminum based metallization or via a damascene process with copper based interconnects.

Due to an increase in device density provided by scaling of semiconductor processes to improve circuit performance, it is no longer generally possible to utilize a single metal interconnect level. Multilevel interconnect systems utilizing aluminum, copper, silver, tungsten, titanium nitride, tantalum, tantalum nitride, as electrical conductors and silica, doped silica and low K dielectric materials have been employed.

Similarly, other metals and electrically conductive metal compounds, such as tungsten, Pt, Ta, and TiN, can be patterned using a damascene process using silicon dioxide or a low K silicon dioxide like film as a dielectric material. During associated processing, a silicon dioxide or a low K material planarization step may be necessary. Presently, although showing high removal rate, silica based slurries used for this purpose lead to removal of significant amount of silicon dioxide or low K dielectric material because of poor planarity or lack of an auto-stop feature. The low K materials used in interconnect applications may also be capped with a thin layer of silicon dioxide so that the stresses on the low K material are significantly reduced. In this case, the surface silicon dioxide layer needs to be planarized.

There may be number of emerging applications such as ferroelectric random access memory devices (FeRAM), tunneling magnetoresistance (TMR) or giant magnetoresistance (GMR) devices where copper is deposited on a metal or a dielectric structure. In a FeRAM, copper may be used as the interconnecting metal or as sandwich metal layer on a gate electrode system. In a TMR or a GMR device, copper can be used as a back terminal, front-end terminal or an electrode on a multilayer magnetic/non-low K dielectric or silicon nitride material surface with removal of the minimum amount of materials as possible.

Other applications for silicon dioxide planarization is for optical dielectric components, and photonic band-gap devices which have alternating areas of high and low refractive index materials. To form these structures, planar polishing of silicon dioxide or similar materials (variants of silicon dioxide) must generally be performed. Other examples include the formation of multilevel MEMS structures. In these cases it may be necessary to remove silicon dioxide and low K films while at the same time planarizing the surface.

Finally, several applications mentioned above may require smoothing of surfaces without substantial removal of material. To smooth surfaces, the polishing rate of the dielectric is preferably less than 500 Å/min. This process is sometimes termed surface smoothening and referred to as chemical-mechanical smoothening (CMS). Such smooth surfaces can be excellent templates to fabricate a variety of novel structures.

SUMMARY OF THE INVENTION

A slurry for chemical mechanical polishing (CMP) a structure including a silicon dioxide or a low K dielectric film and a silicon nitride containing film includes a plurality of particles and at least one selective adsorption additive. The selective adsorption additive is substantially adsorbed by the silicon nitride containing film, but is not substantially adsorbed by the silicon dioxide or low K dielectric film. In one embodiment, the adsorption additive is substantially adsorbed by the silicon dioxide or low K dielectric film only when a pad pressure is below a predetermined value. The predetermined value can be from 1 to 15 Psi, 0 to 7 Psi, from 1 to 4 Psi, or from 3 to 6 Psi.

In another embodiment of the invention, known as chemical mechanical smoothening (CMS) of a dielectric, the adsorption additive is substantially adsorbed by the dielectric throughout the range of polishing pressures. The average removal rate of the dielectric is generally less than about 500 Å/min for CMS.

As used herein, "substantial adsorption" relative to a given layer is defined as a CMP polishing rate (for a given slurry and CMP polishing conditions) without the adsorption additive being at least 4 times or more the CMP polishing rate when the slurry includes the adsorption additive/ additives. On the other hand, non-substantial adsorption relative to a given film is defined herein as a CMP polishing rate (for a given slurry and CMP polishing conditions) without the adsorption additive being less than 4 times the polishing rate of the layer when the slurry includes the selective adsorption additive/additives.

The term "silica like materials" includes materials such as crystalline and amorphous silica, nanoporous amorphous and crystalline silica, silica doped with other materials, such as carbon, nitrogen, fluorine. The term dielectric refers to non-electrically conducting materials such as silica, silicon dioxide (doped and undoped), low K dielectric materials, alumina, and silicon nitride. Silicon nitride containing materials or films, as used herein, include materials such as silicon nitride, silicon oxy nitride, or silicon nitride doped with materials such as carbon and oxygen. The dielectric can be in different structures such as an overlying silicon dioxide layer, on top of patterned silicon nitride layer in STI, or a underlying dielectric layer below at least one metallic layer such as copper, aluminum, silver, tungsten, tantalum, platinum, iridium, hafnium, nickel, iron, as well as their alloys and electrically conducting oxides and nitrides.

The selective adsorption additive can comprise surfactants or soluble polymers, or mixtures of the same. The selective adsorption additive may include one or more soluble polymers which adsorbs onto the surface of the dielectric film. Polymers can be selected from polyethylene oxide (PEO), polyacrylic acid (PAA), polyacryamide (PAM), polyvinylalcohol (PVA) and polyalkyamine (PAH).

In one embodiment, the selective adsorption additive comprises a mixture of at least one anionic surfactant and at least one cationic surfactant. The selective adsorption additive can include a mixture of surfactants including at least one surfactant from at least two of the groups consisting of anionic, cationic, zwitterionic and non-ionic surfactants.

The slurry particles can include abrasive cores, such as silica, silicon nitride, nanoporous silica, silica coated ceria, silica coated with manganese oxide, titania, and alumina coated with silica. The particles can be composite particles, the composite particles including an abrasive core surrounded by a shell including the selective adsorption additive. The selective adsorption additive can be substantially adsorbed by the plurality of particles.

The plurality of particles can be multiphase particles comprising a first material coated with a second material, wherein the second material is chemically equivalent to the silicon dioxide, the low K dielectric layer or the silicon nitride containing film.

A CMP process using the slurry can provide a normalized polishing rate to pressure ratio (NPPR) value for polishing silicon dioxide or the low K dielectric layer of at least 1.2 for a CMP polishing process performed between pressures from about 1.5 to 6.5 Psi, from about 3.0 to 9.0 Psi, 4.5 to 15 Psi or from 5.7 to 16.0 Psi. Normalized polishing to pressure ratio is defined herein as:

$$NPPR(P_1, P_2)=(RR_{P2} \times P_1)/(RR_{P1} \times P_2)$$

where $RR_{P2}$ is the removal rate at pressure $P_2$, and $RR_{P1}$ is the removal rate at pressure $P_1$.

A conventional silicon dioxide based slurry for silicon dioxide polishing exhibits a NPPR approximately 1 or less. A value of 1 corresponds to a linear polishing rate. In this conventional process, as the pad pressure is increased the polishing rate also increase linearly and at the same rate as the pressure. A value substantially less than 1 indicates that the pressure is very little effect on the polishing rate, whereas a value less than 0.7 may indicate that high non-planarity in the polishing process either due to etching, or slurry having a high chemical action. A NPPR value greater than 1 will result in higher surface planarity during the polishing process. A value of 1.20 or higher will generally indicate excellent planarity of the polishing process.

Preferably, the value of NPPR is greater than 1.5 or even more preferably the value of NPPR is greater than 2.0 when measured between 2.0 and 7.0 Psi. In another embodiment, the NPPR value is greater than 1.2 when the pressure range is between 3 and 7 Psi, between 4 and 7 Psi, between 1 and 3 Psi, between 5 and 7 Psi, between 5 and 12 Psi, or between 6.0 and 16 Psi. In yet another embodiment of the invention, the NPPR value for silicon dioxide or low K dielectric polishing is greater than 1.5 when the pressure is between 1.5 and 3 Psi, or between 1 and 7 Psi, respectively.

The slurry can provide an adsorption ration (AR) of at least 4.0 for the silicon nitride containing film and no more than 4.0 for the silicon dioxide or low K dielectric film. In another embodiment, the AR value for silica or low K dielectric is greater than 4 for pressures in the pressure range below 7 Psi, and less than 4.0 for pressures above 10 to 15 Psi. The AR of a material X when polished with a specific abrasive, denoted as $AR_X$, and is defined as the CMP polish rate without surfactant or polymer additive divided by the CMP polish rate in presence of the surfactant or polymer additive. The AR of the nitride or nitride like film is preferably at least 10, more preferably at least 20, and more preferably greater than 100. For CMS, the AR of all dielectric films can be greater than 4.0, while the removal rate is generally less than 500 Å/min. In another embodiment, the AR values are greater than 4.0 when the polishing is conducted at pressures at nominal pressures not greater than 7.0.

The slurry can provide a selective adsorption ratio (SAR) of the silicon nitride containing film to the silicon dioxide or low K dielectric film of at least 5 to 50, preferably at least 100, and more preferably at least 500. Selective adsorption ratios (SARs) are defined herein by comparing the adsorption ratios (ARs) of two materials, such as X and Y. The selective adsorption ratio of material X compared to material Y, denoted by $SAR_{X/Y}$ at a particular concentration "C" of the surfactant or polymer additive/additives is what is expressed by SAR.

A CMP process using the slurry can provide a selectivity of at least 50 for polishing the silicon dioxide or the low K dielectric film relative to the silicon nitride containing film for a CMP process run under acid pH conditions.

A slurry for chemical mechanical polishing (CMP) a structure including a silicon dioxide or a low K dielectric film and a silicon nitride containing film includes a plurality of particles and at least one selective adsorption additive. The selective adsorption additive coats the plurality of particles with a soft shell. The plurality of particles can comprise silica, silicon nitride, nanoporous silica, silica coated ceria, silica coated with manganese oxide, titania, and alumina coated with silica. The slurry provides non-substantial adsorption of the selective adsorption additive for silicon dioxide or the low K dielectric film in a CMP process at a pressure above a predetermined first pressure, and substantial adsorption of the selective adsorption additive at a pressure below a predetermined second pressure, wherein the first pressure is greater than the second pressure. The first pressure can be at least 5 Psi. Alternatively, the first pressure can be at least 3.5 Psi and the second pressure can be no more than 3.0 Psi.

During polishing of the silicon dioxide or low K dielectric layer, the silicon dioxide or low K dielectric surface can be efficiently planarized due to non-substantial or substantial adsorption of the additive, depending on the pressure applied in the polishing process. High planarization efficiency can result from non-linear polishing characteristics of silicon dioxide or low K material or similar materials as a function of pressure. At relatively high points in the circuit topography where the pressure is high, rapid removal of the material takes place. In contrast, in low topographical areas where the pressure is lower, slower removal of the material takes place. This process results in rapid planarization of the silicon dioxide or low K dielectric film when compared to conventional slurries which typically show linear removal rates as a function of pad pressure.

When pressure dependent polishing is used to form silicon dioxide-based STI structures, once the top layer of silicon dioxide is polished off, the polishing process automatically stops because of substantial adsorption of the adsorption additive with the underlying silicon nitride surface. Under these conditions, essentially no silicon nitride is removed. When pressure dependent polishing is used to form metallic interconnect based structures which are separated by a dielectric film, the polishing slurry accomplishes both high polishing selectivity and high planarity at the same time. The polishing selectivity refers to the polishing rate of the metal with respect to the dielectric. If the embedded dielectric structure is non-planar, the high polishing rate of the dielectric is achieved because of the high local pressures induced due to a rough surface. Once the surface planarizes, the polishing rate slow down considerably because the local pressure decreases with increasing surface planarity.

The selective adsorption additive can comprise at least different two surfactants or at least one soluble polymer. The selective adsorption additive can include at least one surfactant selected from at least two of the groups consisting of anionic, cationic, zwitterionic and non-ionic surfactants.

A slurry for chemical mechanical smoothening (CMS) a structure including a dielectric film or a metal structure embedded in a dielectric film includes at least one adsorption additive, a plurality of composite particles, the composite particles including an abrasive core and a soft shell comprising the adsorption additive, wherein the adsorption additive is substantially adsorbed by the dielectric film. The dielectric film can comprise silicon dioxide, a low K dielectric, silicon nitride or alumina, either as a single dielectric structure, or a part of a embedded structure as in the case of STI, and metal-dielectric structure. The dielectric film can be an underlying layer below a metal layer, the metal layer selected from Ta, TaN, W, WN, TiN, Cu, Al, Ag, or alloys thereof.

The adsorption additive can provide pressure dependent adsorption, wherein the adsorption additive provides a normalized polishing rate to pressure ratio (NPPR) of at least 1.2 for the dielectric. The NPPR value can be realized in a pressure range from about 1 to 20 Psi. The adsorption additive can include a mixture of surfactants including at least one anionic surfactant and at least one cationic surfactant.

A slurry for chemical mechanical polishing (CMP) a dielectric film or a metal structure embedded in a dielectric film includes a plurality of particles and at least one adsorption additive, wherein the adsorption additive is substantially adsorbed by the dielectric film only when a pad pressure is below a predetermined value. The dielectric can comprise silicon dioxide, low K dielectrics, silicon nitride or alumina. The predetermined pad pressure can be from 0 to 7 Psi, 1 to 4 Psi, or 3 to 6 Psi, 3 to 9 Psi, or 6 to 16 Psi.

The adsorption additive can comprise at least one surfactant including a mixture of at least one anionic surfactant and at least one cationic surfactant or a mixture of surfactants including at least one surfactant from at least two of the groups consisting of anionic, cationic, zwitterionic and non-ionic surfactants. The adsorption additive can comprise at least one soluble polymer.

The plurality of particles can include a plurality of abrasive cores, the abrasive cores comprising at least one selected from the group consisting of silica, silicon nitride, nanoporous silica, silica coated ceria, silica coated with manganese oxide, titania, and alumina coated with silica. The plurality of particles can be composite particles, the composite particles including an abrasive core surrounded by a shell including the selective adsorption additive.

A slurry for CMP of a structure including a silicon dioxide or low K dielectric layer over a silicon nitride layer includes a mixture of additives including at least one adsorption additive or one soluble polymer additive, wherein a CMP process using the slurry provides a NPPR value of at least 1.3 in a predetermined pressure range. The predetermined pressure range can be from 2 to 6 Psi, 4 to 12 Psi, or 5 to 15 Psi. A CMP process using the slurry can provide a selectivity of at least 30 for the silicon nitride layer to the silicon dioxide or the low K dielectric layer. The pH of the slurry can be from 1 to 8.

A method for chemical mechanical polishing (CMP) of a structure including a silicon dioxide or a low K dielectric film and a silicon nitride containing film to form a shallow trench isolation (STI) structure includes the steps of providing a slurry including a plurality of particles, and at least one selective adsorption additive, wherein the selective adsorption additive is substantially adsorbed by the silicon nitride containing film but is not substantially adsorbed by the silicon dioxide or the low K dielectric film and applying the slurry to the structure. The selective adsorption additive can be substantially adsorbed by the silicon dioxide or the low K dielectric film only when a pad pressure is below a predetermined value. The method can provide a normalized polishing rate to pressure ratio (NPPR) of at least 1.2 for the silicon dioxide or the low K film.

A method for chemical mechanical smoothening (CMS) of surfaces including at least one dielectric film, such as silicon dioxide, silicon nitride, alumina and low K dielectrics, includes the steps of providing a slurry including a plurality of particles and at least one selective adsorption additive, wherein the selective adsorption additive is substantially adsorbed by the dielectric film over a pressure range up to at least 10 Psi, and preferably up to 20 Psi. The surface roughness of the dielectric layer can be less than 2 Å following the method.

A method for planarizing dielectric films includes the steps of providing a slurry including a plurality of particles and at least one selective adsorption additive, wherein the selective adsorption additive is substantially adsorbed by the dielectric film, and applying the slurry to the structure using a CMP apparatus, wherein the method provides a normalized polishing rate to pressure ratio (NPPR) of at least 1.2 for the dielectric film. The plurality of particles can comprise composite particles including an abrasive core surrounded by a shell including the selective adsorption additive. The planarization can be performed for MRAM, inter-level dielectric metallization, formation of photon band-gap materials, gate metallization for CMOS devices, ferromagnetic memories and MEMS based devices and dielectric polishing of optical components.

BRIEF DESCRIPTION OF THE DRAWINGS

A fuller understanding of the present invention and the features and benefits thereof will be accomplished upon review of the following detailed description together with the accompanying drawings, in which:

FIG. 1(a) illustrates a structure immediately before a CMP process to form a shallow trench isolation (STI) structure, while FIG. 1(b) shows the resulting STI structure after CMP.

FIG. 15 is a table showing silicon nitride removal rate and its adsorption ratio (AR) when slurries with varying silicon nitride particle sizes are used in conjunction with anionic (SDS), cationic (CTAB) and zwitterionic (Dapral GE 202) surfactants.

FIG. 16 is a table showing the effect of different core particle on the AR of silicon nitride.

FIG. 17. is a table showing the effect of pH on the AR ratio of silicon nitride when polished with 80 nm, 2 weight percent silicon nitride particles and a zwitterionic surfactant.

FIG. 18 is a table showing adsorption ratios on silicon nitride when a slurry containing mixed surfactants and other additives, such as polymers and salts, are used.

FIG. 19 is a table showing the adsorption ratios on silicon dioxide and low K dielectric (carbon doped silica) using a single cationic surfactant (CTAB).

FIG. 20 is a table showing the adsorption ratios on silicon dioxide and low K dielectric (carbon doped silica) using mixed surfactants at different concentrations.

FIG. 21 is a table showing adsorption ratios of silicon dioxide as a function of pH when 2 weight percent silica particles were used in the slurry.

FIG. 22 is a table showing the adsorption ratio of silicon dioxide at different pad pressures when mixed surfactants are used.

FIG. 23 is a table showing the selective adsorption ratio of silicon nitride to silicon dioxide when mixed or single additives are used.

FIG. 24 is a table showing the selective adsorption ratio as selectivity of silicon nitride to silicon dioxide as a function of pH when a single surfactant additive was used.

FIG. 25 shows the NPPR and pressure dependent removal rate of silicon dioxide when mixed additives are used in the slurry.

DETAILED DESCRIPTION OF THE PREFERRED EMBODIMENTS

Figure 1:
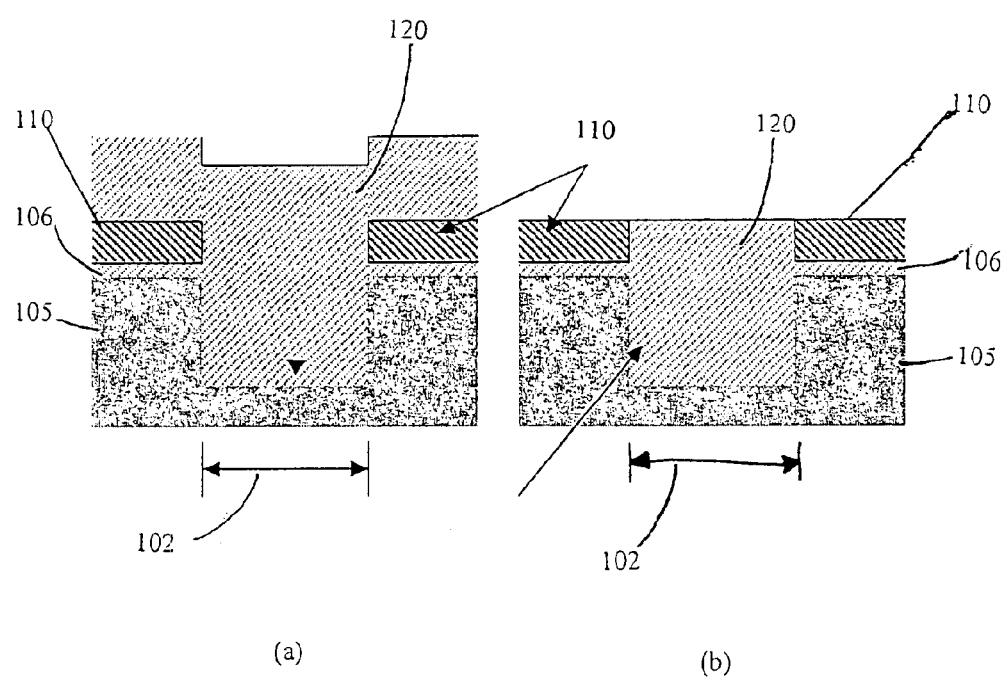
Figure 2:
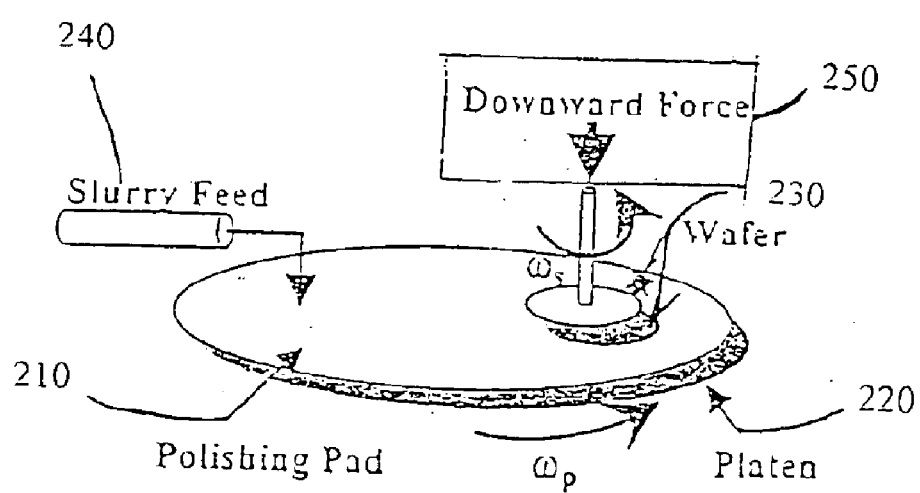
FIG. 2 is a perspective view of a conventional CMP polisher.

The invention relates to slurries and chemical mechanical polishing (CMP) processes for polishing of silicon dioxide or other dielectric materials such as low K dielectrics, and silicon nitride for applications including semiconductor devices, optical devices, magnetic devices, and MEMS manufacturing. In semiconductor manufacturing, applications for the invention include deep and shallow trench isolation structures, planarization of silicon dioxide and low K dielectrics, and chemical mechanical smoothening (CMS) of silicon dioxide, low K dielectrics, silicon nitride, alumina, and their related compounds. In both CMP and CMS, the resulting surfaces are planarized. However, in the case of CMS, the removal rate is generally less than about 500 Å/min.

A slurry includes a plurality of particles and at least one selective adsorption additive. The particles are preferably composite particles, the composite particles including an inorganic or insoluble organic core surrounded by a shell provided by the selective adsorption additive.

For STI applications, the underlying dielectric is generally a silicon nitride comprising film. In one embodiment of the invention, the silicon nitride comprising film substantially adsorbs the additive/additives, whereas other dielectric film or films, such as silicon dioxide or a low K dielectric, show non-substantial adsorption characteristics under all polishing pressures. In another embodiment of the invention for STI applications, the silicon dioxide or low K dielectric can show non-substantial adsorption of the adsorption additive above a predetermined pressure, such as at pressures of about 5 Psi or more, and substantial adsorption of the adsorption additive at pressures below the predetermined pressure. In both of these cases, the slurry exhibits substantial adsorption with the underlying silicon nitride comprising layer over the whole pressure range.

In another embodiment of the invention, CMS is performed. For CMS applications, the dielectric films, such as silicon dioxide, silicon nitride, low K and alumina preferably show substantial adsorption for all pressure ranges.

Inorganic core particles can be silica, nanoporous particles, silicon nitride, alumina, yttria, zirconia, ceria or these particles coated with silica, ceria, silicon nitride, silicon carbide, nanoporous materials, or insoluble polymeric films such as polystyrene, PTFE (Teflon). Core particles can be multiphase particles, where the cores are coated or mixed with another layer. Regardless of whether a single-phase core or multiphase cores are used, the adsorption additive can be adsorbed on the surface of the respective particles. In another preferred embodiment of the invention, the surface of the particle cores is composed of an inorganic particle coated with a non-soluble polymer having a chemical composition similar to the silicon dioxide or low K dielectric layer to be polished.

The primary size of the core particles can vary from 5 nm to 50 microns. The preferred size is between 10 nm to 500 nm. The primary particle size refers to the minimum unaggregated size of the particles. Preferred single-phase core particles are silica, silicon nitride, and nanoporous silica.

Figure 3:
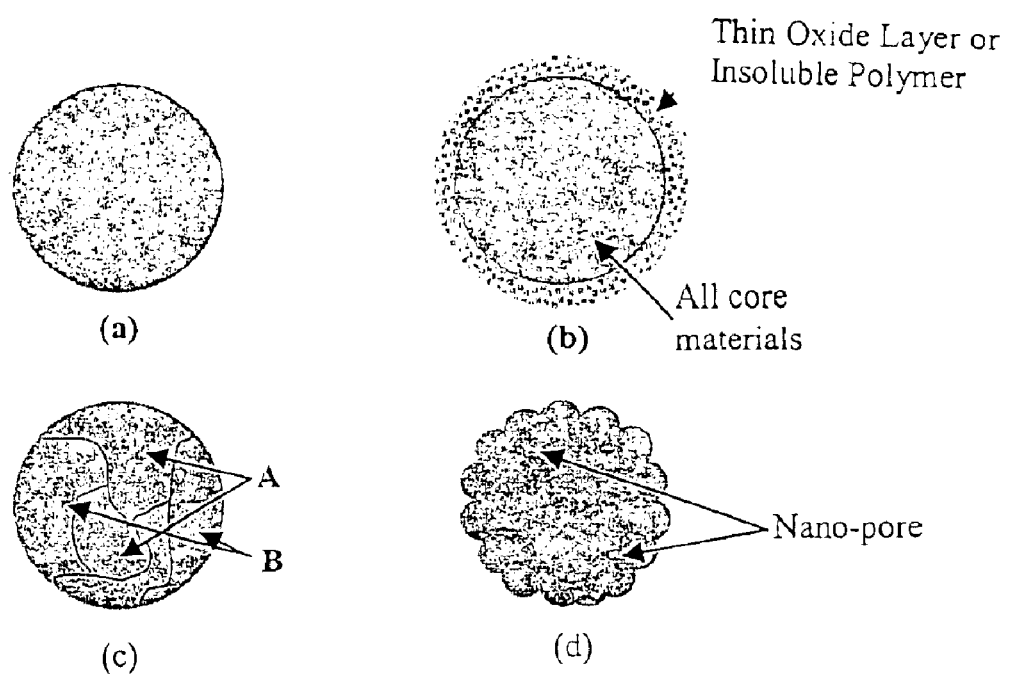
FIG. 3(a)–(d) are schematics of exemplary core of particles showing single phase and coated mixed phase particles.
Figure 4:
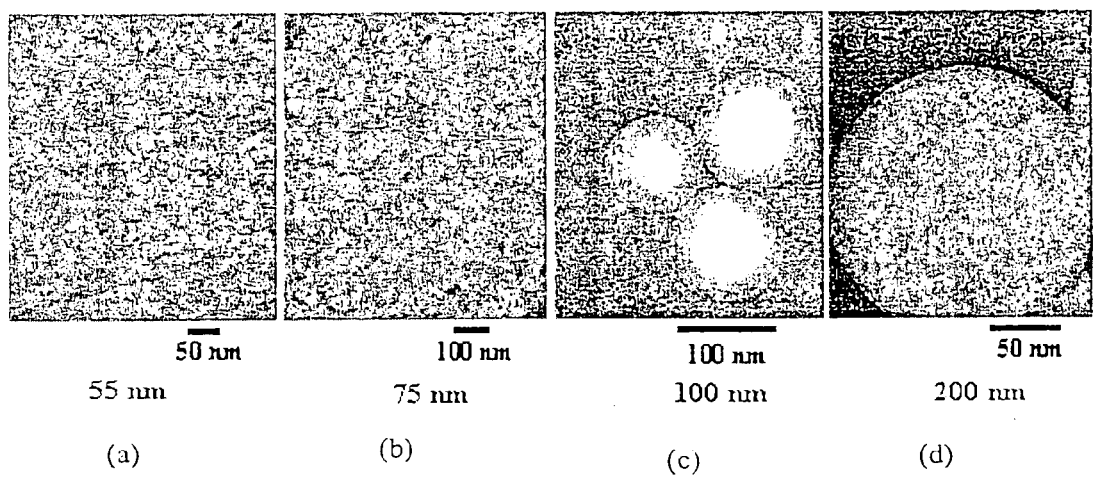
FIG. 4(a)–(d) are TEM photographs of composite core silica particles of different sizes.

A pictorial representation of cores made up of 4 different exemplary material types, being inorganic single-phase particles, coated particles, mixed composite particles and nanoporous particles are shown in FIGS. 3(a), (b), (c) and (d), respectively. The particles shown in FIGS. 3(b) and (c) are multiphase core particles, the multiphase core particles including two different materials. FIG. 3(d) shows a nanoporous particle having a plurality of nanopores.

FIGS. 4(a) to (d) illustrate schematics of silica particle cores having various sizes. The sizes shown range from about 45 nm in FIG. 4(a) to about 200 nm in FIG. 4(d). The particle size can varied beyond the range shown.

Multiphase core particles can be particles with an internal composition of either silica, zirconia, alumina, titania, silicon nitride, silicon carbide, ceria and manganese oxide or its mixtures having at least one optional solid coating of a composition being different from its internal (core) composition. For example, the solid coating can be a thin layer of semiconductor or an oxide of these materials, or an insoluble polymer. The coatings can be continuous or discrete and provide 2% to 100% core particle surface area coverage. The coatings preferably have different hardness and surfactant adsorption characteristics compared to the bulk material comprising the particle. The thickness of the coatings can vary from 0.5 nm to 500 nm. The preferred thickness of the solid coating is between 10 nm to 100 nm. To make the shell structure, the surfactant and polymer additives can be weakly or strongly adsorbed onto the surface. The substantial adsorption and non-substantial adsorption additives can be soluble polymeric species or surfactants, either being present a single species or a plurality mixed together.

A preferred coated particle is alumina or silica, the core particle coated with silica, a low K dielectric, doped silica, carbon doped silica, nanoporous silica or an insoluble polymeric layer. More preferred coated particles include alumina coated with silica, silica coated with nanoporous silica, silica coated with cerium oxide, and silica coated with insoluble polymeric layer.

Figure 5:
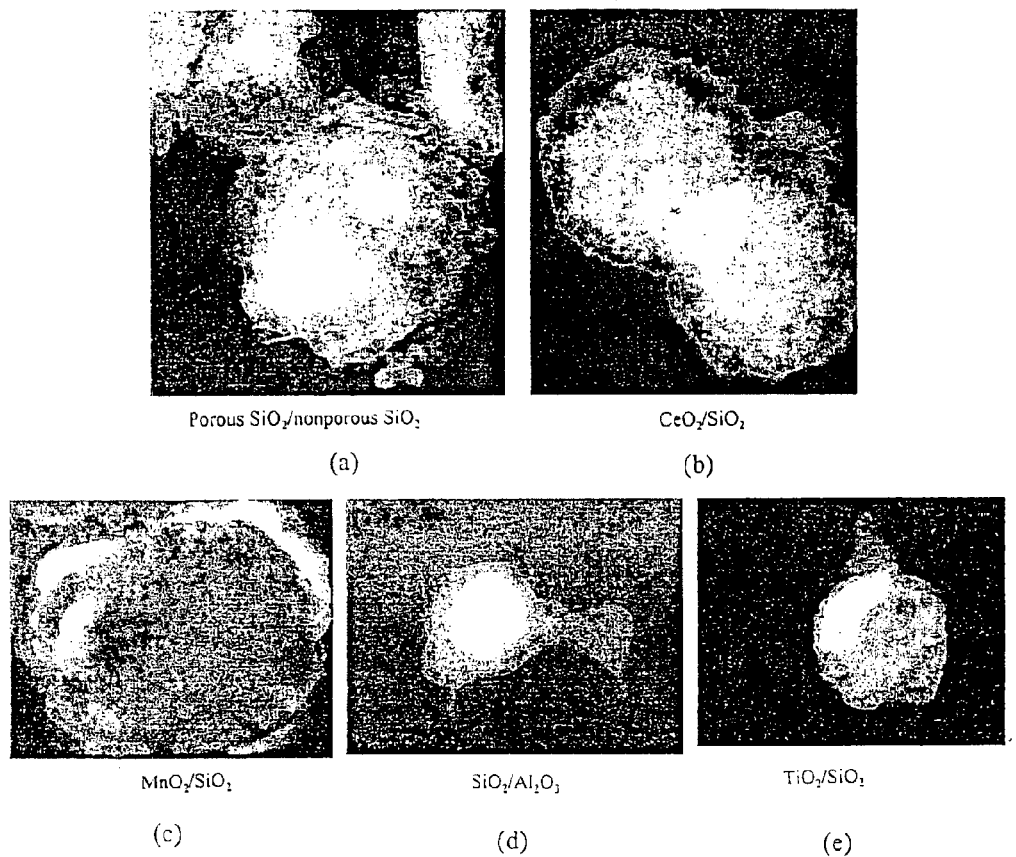
FIG. 5(a)–(e) are TEM photographs of coated particles which can be used in a slurry.

FIGS. 5(a)–(e) show examples of coated particle made by wet precipitation techniques. FIG. 5(a) shows porous silica coating on nonporous silica. FIG. 5(b) shows $CeO_2$ on silica, while FIG. 5(c) shows $MnO_2$ on silica. Finally, FIG. 5(d) shows silica on $Al_2O_3$, while FIG. 5(e) shows $TiO_2$ on silica.

Figure 6:
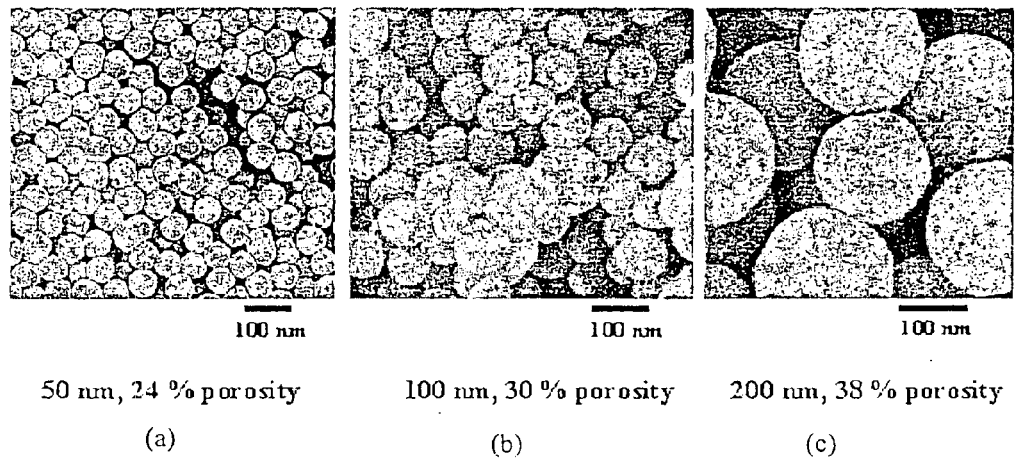
FIG. 6(a)–(c) are TEM photographs of porous silica particles of various sizes and levels of porosity.

FIGS. 6(a)–(c) are TEM photographs of nanoporous core particles having different sizes and porosities. Nanoporous particles refer to materials such as silica, and alumina, which have a size ranging from 5 nm to 1000 nm and pore sizes ranging from 1 Å to 100 Å, and porosity ranging from 0.5% to 50%. FIG. 6(a) shows 50 nm particles with 24% porosity. FIG. 6(b), shows 100 nm particles with 30% porosity, while FIG. 6(c) shows 200 nm particles with 38% porosity. A preferred example of a nanoporous particle is silica with porosity varying from 1% to 80% of the total particle volume.

Nanoporous silica particles can be formed by a modified Stober process (W. Stober, A. Fink, E. Bohn, J. Colloids and Interfacial Science, 26, 62–69 (1968)). The particle size can vary from 20 nm to 500 nm, while the porosity can vary from 10 to 60%. As the porosity of the surface increases, the number of adsorption sites are expected to decrease.

The cores of the composite particles can be selected to achieve desired mechanical, surface chemical and selective adsorption additive (surfactant or polymer) adsorption characteristics, respectively. For example, if a particular hardness and surface characteristic is desired, the core can be composed of a hard core, such as alumina, silicon nitride, and coated with a thin layer such as silicon dioxide, low K dielectric or a soft non-soluble polymer. Thus, particles with specific desired mechanical and additive adsorption properties can be obtained. The mechanical properties of the composite particles are primarily controlled by the properties of the bulk material comprising the core, but the surfactant/polymer adsorption properties are controlled by the coated layer on the core particle.

It may also be possible to change the selective adsorption additive (surfactant or polymer) adsorption site density at surfaces including the surface of the core particle. This can be done by forming a core particle from two or more distinct phases, or having a nanoporous particle structure. If a hydrophobic surface is desired, a metal or graphite particle or a non-soluble polymeric coating on the core particle can be used, or an insoluble polymer with partially hydrophobic character.

The control and modulation of the polishing characteristics can be achieved by substantial and non-substantial adsorption of the surfactants or polymer additives onto the particle, silicon dioxide or low K dielectric film, and the silicon nitride comprising film.

Figure 7:
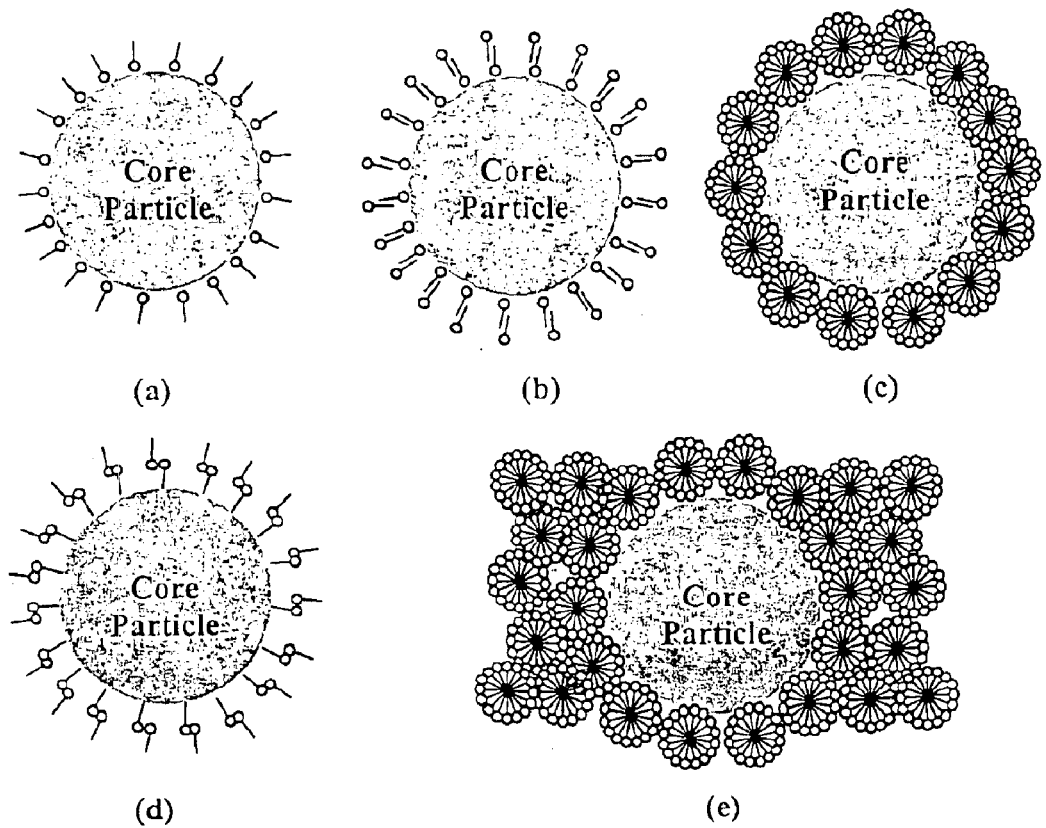
FIG. 7(a)–(e) illustrate some possible shell configurations for composite particles having various surfactant layer structures disposed on core particle surfaces.

If present, the adsorbed surface layer disposed on the core particles or the dielectric may be in the form of partial layer coverage or in the form of the three-dimensional self assembled layer on the surface. Examples of three-dimensional self-assembled layers include, bilayers, spheres, hemispheres, cylinders, and rods, reverse micellular structures. If used, polymeric additives can attach to the surface can be in the form of coils or in form of flattened or extended structures. FIGS. 7(a)–(e) illustrate some possible shell configurations for composite particles having various surfactant layer structures disposed on surfaces showing substantial adsorption. FIG. 7(a) shows a single layer shell, FIG. 7(b) a bi-layer shell, FIG. 7(c) a spherical shell, FIG. 7(d) a reverse bi-layer shell, and FIG. 7(e) a cylindrical shell.

It is also desirable to ensure that the slurry particles are stable in a colloidal suspension in the normally high ionic strength slurry. This can be difficult because the high ionic strength of the slurry can shield the electrostatic charges in slurry, which are critical in maintaining the slurry stability. The theory of Derjaguin, Landau, Verwey and Overbeek (DLVO theory) predicts suspension stability when the surface charge of the particles are high and the formation and overlap of the electric double layer between two particles prevents agglomeration of the particles. However, the presence of salts in high ionic strengths can screen the surface charges and destabilize the slurry. The substantial adsorption of the surfactant/polymer additives onto the dielectric layers and the inorganic core particles helps maintain the stability of the slurry.

To be able to achieve the wide range of variability in the particle interactions with different dielectric layers, the invention provides a slurry including a plurality of composite particles, the composite particles comprising core abrasive particles surrounded by a soft shell of a surfactant or polymer layer which may be weakly or strongly adsorbed onto the particle surface. These additive layers can either be composed of individual additive molecules or in form of self-assembled structures which can be in form of aggregates such as micelles. The adsorption strength of these additives contribute to modulation of the polishing rates, and pressure dependent effects as discussed in detail in the subsequent sections of this application. Substantial and non-substantial adsorption effects on different surfaces contribute to significant aspects of this invention. The shape of the micelles can vary from cylindrical, spherical, bilayer, hemispherical or other shapes, depending on factors such as the nature of the interaction with the wafer surface, the concentration of surfactant, the presence of ions, and the nature of the head and tail group of the surfactants.

Slurry stability can be improved by the surfactant because the surfactant or polymer covered particles repel one another and as a result tend not to agglomerate. This repulsion is due to steric forces.

A variety of surfactants and polymer additives can be used with the invention. To achieve slurry stability and modulate the polishing characteristics of both silicon dioxide or low K dielectric and silicon nitride comprising layer it may be necessary to use more than one surfactant or polymeric additives. Surfactants are generally characterized by a hydrophilic head group and a hydrophobic tail group. Examples of tail groups include straight chain, long alkyl groups (carbon chain length varies from $C_8$ to $C_{20}$), branched chains, long chain ($C_8$–$C_{15}$ alklybenzene residues, long chain perfluoroalkyl groups, polysiloxane groups, and high molecular weight propylene oxide polymers.

The surfactants and polymer additives can be sub-grouped in 5 classes based on the polar head group of the surfactant or polymer additive. The five groups are anionic, cationic, non-ionic, zwitterionic and polymer based additives. A slurry can comprise two or more surfactant/polymer additives chosen from any of the above 5 classes. It is possible that more than 1 additive can come from a given class.

Examples of surfactants can be found in the books "Critical Micelle Concentrations of Aqueous Surfactant Systems" by P. Mukherjee and K. Mysels, published by National Data Standards Reference Service—National Bureaus of Standards (presently called NIST)—NSRDS-NBS-36 (1971) pg. 23–50 ("Mukherjee") and "Surfactants and Interfacial Phenomena" by M. J. Rosen, John Wiley & Sons, 1989, ("Rosen"), on pages 3–32, 52–54, 70–80, 122–132, and 398–401. Mukherjee also lists the bulk CMC values of the various surfactants.

Examples of anionic surfactants include carboxylic acid salts, amine salts, acylated polypetides, sulfonic salts, higher alkylbenzene sulfonates, secondary n-alkanesulfonates, sodium alkene sulfate and sulfonate (SAS), sodium dodecyl sulfate (SDS), ammonium lauryl sulphate (ALS), olefin sulfonates (AOS), sulfosuccinate esters, sulfated linear primary alcohols, sulfuric acid ester salts, phosphoric amides, polyphosporic acid esters, perfluorinated anionics, triethanolamine lauryl sulfate, Hamposyl®, Zonyl®, pottasium stearate and other fatty acids. Zonyl® is a perfluoric anionic based surfactant manufactured by Dupont Corporation, while Hamposyl® is an a class of anionic surfactants manufactured by Dow Chemical Company.

Preferred anionic surfactants include SDS and SAS and their alkali free derivatives, triethanolamine lauryl sulfate, Hamposyl® and Zonyl®. Other anionic surfactants are also listed in pages 30–32 of Mukherjee. The polar head groups include carboxylic acid, monocarboxylate, polycarboxalate, sulfo carboxylic acid, sulfo carboxylate, phophono carboxylic acid, sulfo carboxylic esters, phosphono esters, sulfate, polyol sulfate, thisulfate, aklyl sulfonate, hydroxyl alkyl sulfonate, sulfosuccinate diesters, para alkaryl sulfonate, alkaryl sulfonate oxypropyl sulfate, oxyemethylene sulfate.

Examples of cationic surfactants include long chain amines and their salts, diamines and polyamines and their salts, quaternary ammonium salts, polyoxyethylenated (POE) long chain amines, quaterized polyoxyethylenated long chain amines, amine oxides and cetyl trimethyl ammonium (CTAB). Preferred cationic surfactants include dodecyl trimethylammonium bromide ($C_{12}$TAB) and related compounds, such as $C_8TAB$, $C_{10}TAB$, $C_{14}TAB$, $C_{16}TAB$, $C_{18}TAB$, with varying hydrophobic chain lengths (given by the numeral value). Other preferred examples of cationic surfactants include dodecylammonium chloride (CTAC), cetylpyridium bromide, which is generally referred to as pyridinium. In each of these cases, the hydrophobic chain length is preferably from $C_8$ to $C_{20}$.

Cationic surfactants are listed by their polar head groups from page 32–33 of Mukherjee. Examples of the polar head groups include amines with different tail groups, benzyl, betaine, amino acid, pyridinium, quinolinium, tropylium groups.

Examples of non-ionic surfactants include polyoxyethlyenated alkylphenols, alkylphenol, carboxylic acid, amine, N-Betaine, C-Betaine, amine oxide, phosphine oxide, carboxylate and sulfonate groups, sulfinlyol groups, sugar alkylate, sugar ester, polyol ester, methy-oxethylene ester, methyl oxyethylene ester, oxyethylene sorbitan, oxethylene diol ester, oxethlene alcohol. Other non-ionic surfactants also include polyoxyethlyenated straight chain alcohols, polyoxyethlyenated polyoxypropylene glycols, polyoxyethlyenated mercaptans, long chain carboxylic acid esters polyoxyethlyenated silicones, tertiary acetylenic glycols, Triton X-100™ manufactured by the Dow Chemical Corporation, MI, and TWEEN-80® which is manufactured by the ICI group of Companies, NewCastle, Del. TWEEN 80® is polyoxyethylene sorbitan monooleate, and has the following synonyms: TWEEN 80® 1, polyoxyethylene sorbitol ester; polysorbate 80 and PEG (20) sorbitan monooleate. TWEEN 80® has the molecular formula $C_{64}H_{124}O_{263}$ and a corresponding molecular weight of 13103 Daltons. TRITON X-100® is octylphenol ethylene oxide condensate (also referred to as Octoxynol-9) and has a molecular weight of 625 Daltons.

Preferred examples of non-ionic surfactants include Tween-80™ and the family of Triton X™ compounds. Examples of other non-ionic surfactants are listed from pages 33–36 of Mukherjee.

Zwitterionic surfactants typically have both positive and negative head groups in the same molecule. These surfactants can be mixed with different polymeric additive to modify the adsorption ratios. These surfactants can be mixed with each other to achieve the desired adsorption ratios with respect to silicon nitride polishing. The hydrophobic part of the surfactants consists of carbon based chains. Surfactants having different chain lengths varying from 2 carbon atoms to 20 carbon atoms can be used. The chains can be alkanes, n-alkanes, alkyl aryl, 1-N-alkyl aryl, other N-alkyl aryl, iso-alkyl, p-tertiary octyl benzene, nonyl benzene, oxygen based nitorbenzyl, halogen and heterocyclic compounds.

Examples of zwitterionics include B-N alkylaminopropionic acids, N alkyl-B. iminodipropionic acids, imidazoline carboxylates, N-alkylbetanies, amine oxides, sulfobetanies and KETJENLUBE 522® (also still sometimes referred to as Dapral GE 202) and variants thereof. A preferred zwitterionic surfactant is KETJENLUBE 522®. KETJENLUBE 522® is the current trade name for what had been called DAPRAL GE 202®, now produced by the Akzo Nobel Functional Chemicals Company, Netherlands. This material is a water soluble copolymer of an average molecular weight of approximately 15,000 Daltons and consists of a-olefins and dicarboxylic acids, partially esterified with an ethoxilated alcohol.

The concentration of surfactants used depends on the type of the surfactant used, the surfaces of particles and wafers such as silicon oxide, low K dielectric or silicon nitride which the slurry is contact with, and CMC value of the surfactant. At low concentrations, the surfactant may adsorb onto the solid surfaces in a patchy manner and change the electrostatic properties and the surface energy of the surface. The adsorption of the surfactant under these conditions may reduce the etching of the surface layer. At higher concentrations of the surfactant, the surfactant molecules may coalesce together to form self-assembled structures. Examples of structured surfactants can include spheres, cylindrical rods, bi-layers, disks and vesicles. Once the bulk CMC is reached, the surface tension of the solution does not generally decrease any further, but is accompanied by a rapid drop in the electrical conductivity of the bulk solution. The formation of micelles is thought to be due to the reduction in the free energy of the solution.

A preferred embodiment of the invention uses silica or silica like inorganic cores coated with surfactants to form a hard core-soft shell structure. The inorganic core can be silica, doped silica, nanoporous silica, or hard particle coated with silica, doped silica, or a porous silica layer. For nanoporous silica, or nanoporous silica coated inorganic cores the preferred surfactant is cationic, zwitterionic, or a mixture of cationic/non-ionic/anionic/zwitterionic additives. The ratios of each of the surfactant components can vary across a wide range of concentrations.

The concentration of the surfactant can be from 0.01 times of a bulk critical micelle concentration (CMC) of the solution to 1000 times of the CMC. Preferably, the surfactant concentration is from 0.4 of the CMC to 100 times of the CMC. If CMC values not known or not available, the surfactant concentration can be set in a range from 0.1 mM to 500 mM. The bulk CMC value of the surfactant is defined as the minimum concentration at which the surfactant self assembles to form structured layers in a bulk solution.

The adsorption of surfactant and its self assembly can be measured by a combination of several techniques including Fourier transform infrared spectroscopy (FTIR), adsorption density measurement via solution the depletion method, contact angle measurements and surface force measurements via atomic force microscopy (AFM). The confirmation of micelles at the surface and the bulk of the solution can be investigated using FTIR, AFM, and electrical conductivity and surface tension/contact angle measurements.

The concentration of the surface-active adsorption additives is generally provided such that the surfactants are strongly adsorbed to the surface of the particle cores and the underlying dielectric. The concentration in which micelles form in the bulk of the materials (CMC) varies with the hydrophobic tail and hydrophilic head groups of the surfactant, and presence of the other additives in the solution. In each of these surfactants, the head group and the tail group can be varied to provide similar effects in the slurry but at different concentration levels. In certain cases it may be advantageous to use mixed surfactants to control the adsorption density, the strength of the surfactant adsorption. Examples of some possible synergistic effects are given on pg. 398–401 of Rosen.

The strength of the surfactant adsorption on the surface of the particle or the dielectric surface depends on the density and the nature of adsorption sites on the surface and the chemistry of the solutions. As the present state-of-the art measurements are not sophisticated enough to quantify the strength and the selectivity of the adsorption process, new quantitative methods have been developed to help define the bounds of this invention. This is discussed in detail in subsequent sections of this application.

The surfactant additives described above can be supplanted or used in combination with polymeric additives such as polyethylene oxide (PEO), polyacrylic acid (PAA), polyacryamide (PAM), polyvinylalcohol (PVA), polyalkyamine (PAH) and related polymeric compounds. These polymer additives can be used as dispersants for particles in the slurry. The molecular weight of these additives can be varying from 500 to 100,000 Daltons. The concentration of these additives can vary from 1 mg/liter to 10 g/liter. A preferred concentration of the polymeric additives is from 10 mg/liter to 1 gm/liter. The preferred molecular weight of the polymer additive varies from about 1000 to 10,000 Daltons.

Polymeric additives are generally chosen based on the nature of the surface sites for polymeric adsorption. For example, if silica surface based slurry particle cores are used, the preferred choice of additives are PEO and PVA. If silicon nitride slurry particle cores are used, then preferred polymer additive is PAA, which generally strongly adsorbs to the silicon nitride cores.

Additionally, some salts may be added to control the strength of the surfactant adsorption. In some of these examples, hydrophilic head groups contain alkali metals, such as Na and K. However, it may be possible to replace the alkali metals with other ions, such as ammonium or calcium based, which may be more compatible with semiconductor processing.

Figure 8:
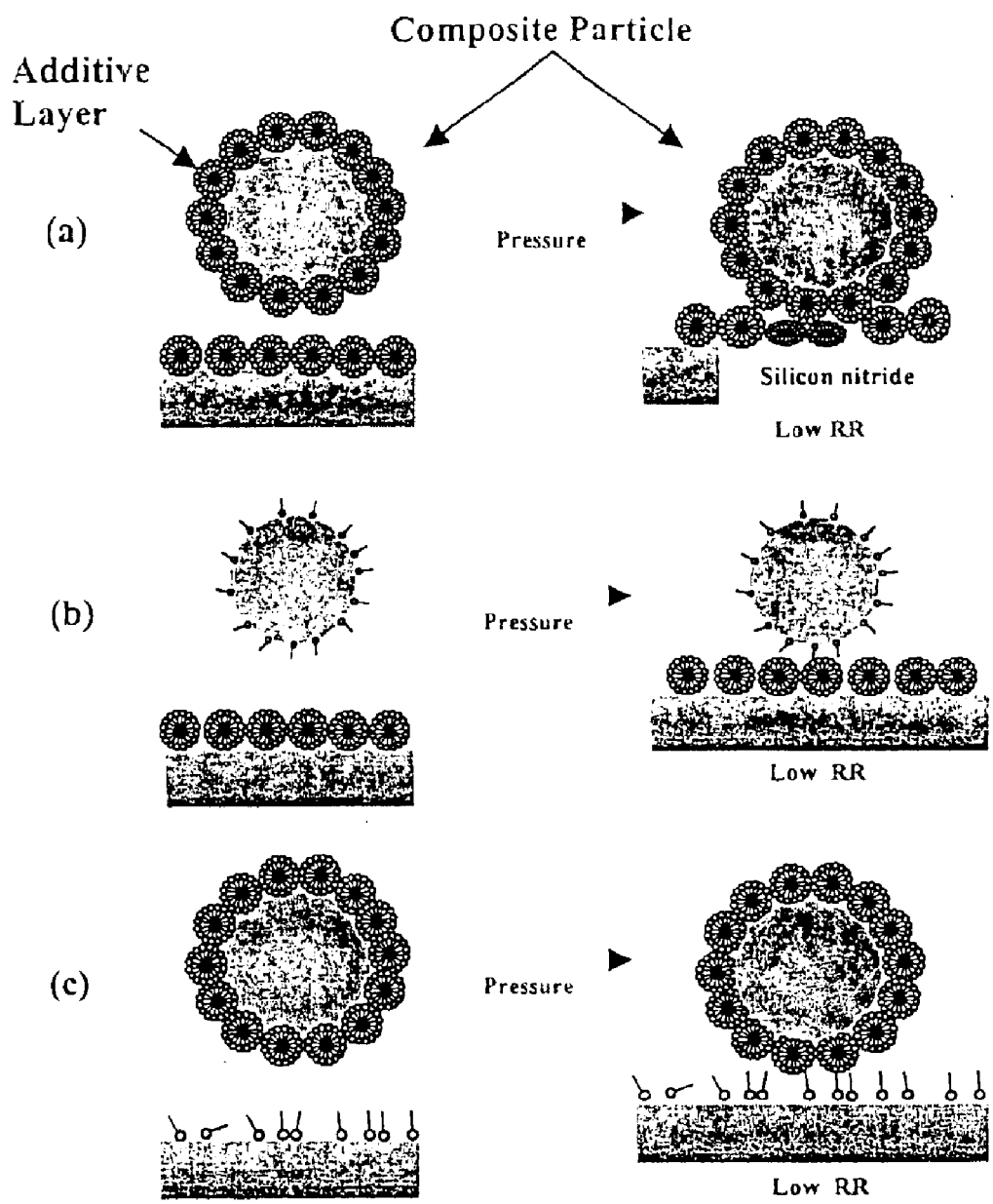
FIG. 8(a)–(c) illustrate schematic diagrams showing possible changes in surfactant structure for a silicon nitride surface as a function of pressure. The term "RR" refers to removal rate.

In the case of formation of STI structures, the adsorption additives play two key roles in terms of modulation of the removal rates for the top layer silicon dioxide and the underlying silicon nitride comprising dielectric layer. The role of adsorption additives in affecting a silicon nitride comprising surface as a function of pressure is shown in FIGS. 8(a)–(c). These FIGs. also illustrate the nature of adsorption of additives on particles. To achieve substantial adsorption effects when both silicon oxide and silicon nitride layers are being polished (during STI formation), either the film or the particle (or preferably both surfaces) should exhibit strong surfactant adsorption characteristics. FIG. 8(a) shows strong adsorption to both the particle and the silicon nitride surface, while FIG. 8(b) and FIG. 8(c) show strong adsorption on only the silicon nitride surface or the particle surface, respectively. In each case shown, the silicon nitride removal rate is low. However, the preferable case is generally either shown in FIG. 8(a) or 8(b).

Besides modulation of the polishing rate of the silicon nitride comprising layer, the adsorption additives also may modulate the polishing characteristics of the top dielectric layer, which is typically silicon dioxide or a low K dielectric material. Silicon dioxide planarization is required for STI, interconnect structures, and a wide range of emerging applications, while low K film planarization is typically required as a dielectric material in interconnect structures. In some cases it may be required to only smoothen the silicon dioxide/low K/silicon nitride surface without substantial removal of material as when CMS is desired. All these three cases can be achieved by controlling the adsorption characteristics of the surfactant/polymer additive.

By using appropriate slurry additives, the following scenarios can be achieved: (A) non-substantial adsorption of the additive under all pressure conditions (B) substantial adsorption under all pressure conditions, and (C) substantial adsorption at low pressure conditions, and non substantial adsorption at high pressure conditions. Typically, the entire pressure range is between 0 and 30 Psi, and more preferably between 0 to 20 Psi. Low pressure can be a pressure range from about 0–7 Psi, whereas high pressure can be a pressure range from between 7 Psi to 20 Psi.

Figure 9:
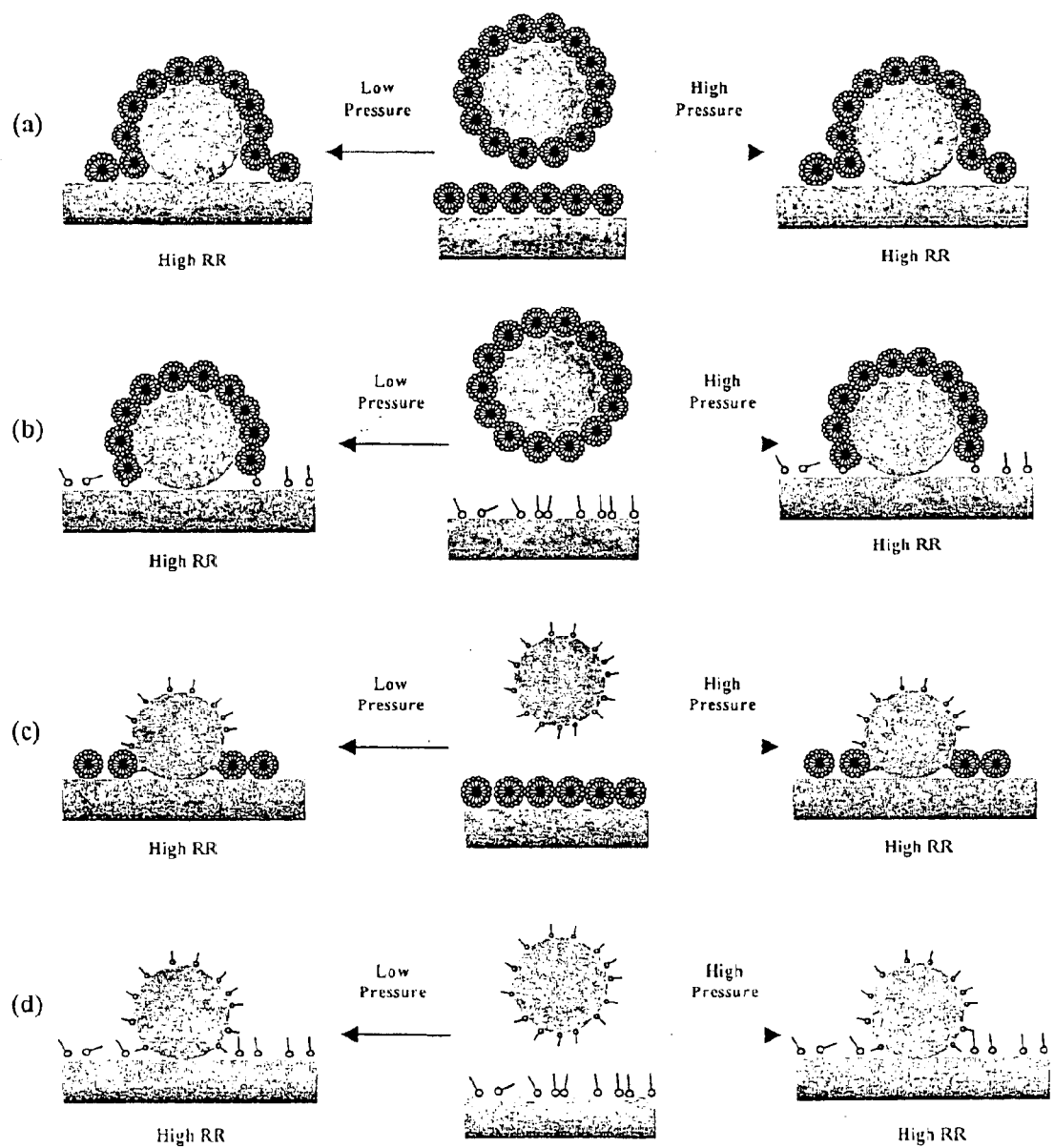
FIG. 9(a)–(d) illustrate schematic diagrams showing various structures of composite particles and the surface of dielectric films which achieve non-substantial adsorption during CMP. The term "RR" refers to removal rate.
Figure 10:
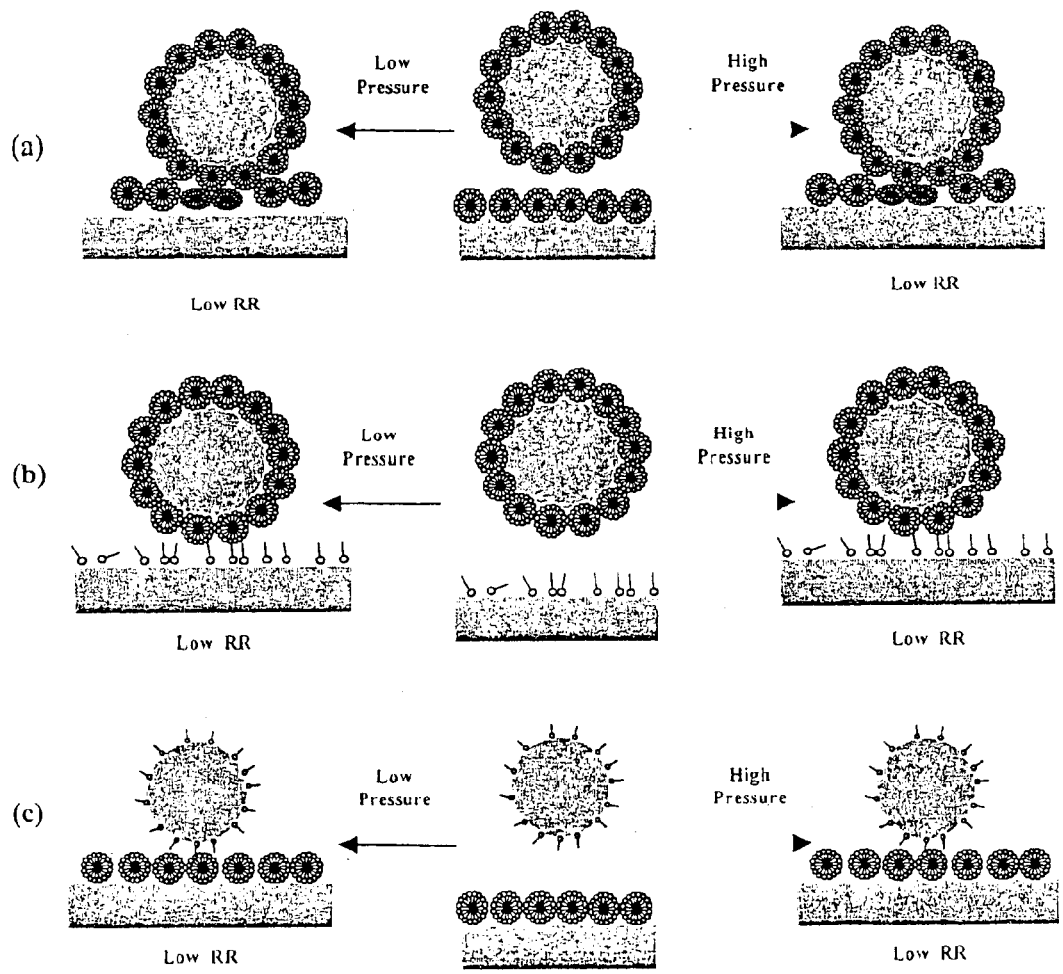
FIG. 10(a)–(c) illustrate schematic diagrams showing various structures of composite particles and the surface of dielectric films which achieve substantial adsorption for CMS.
Figure 11:
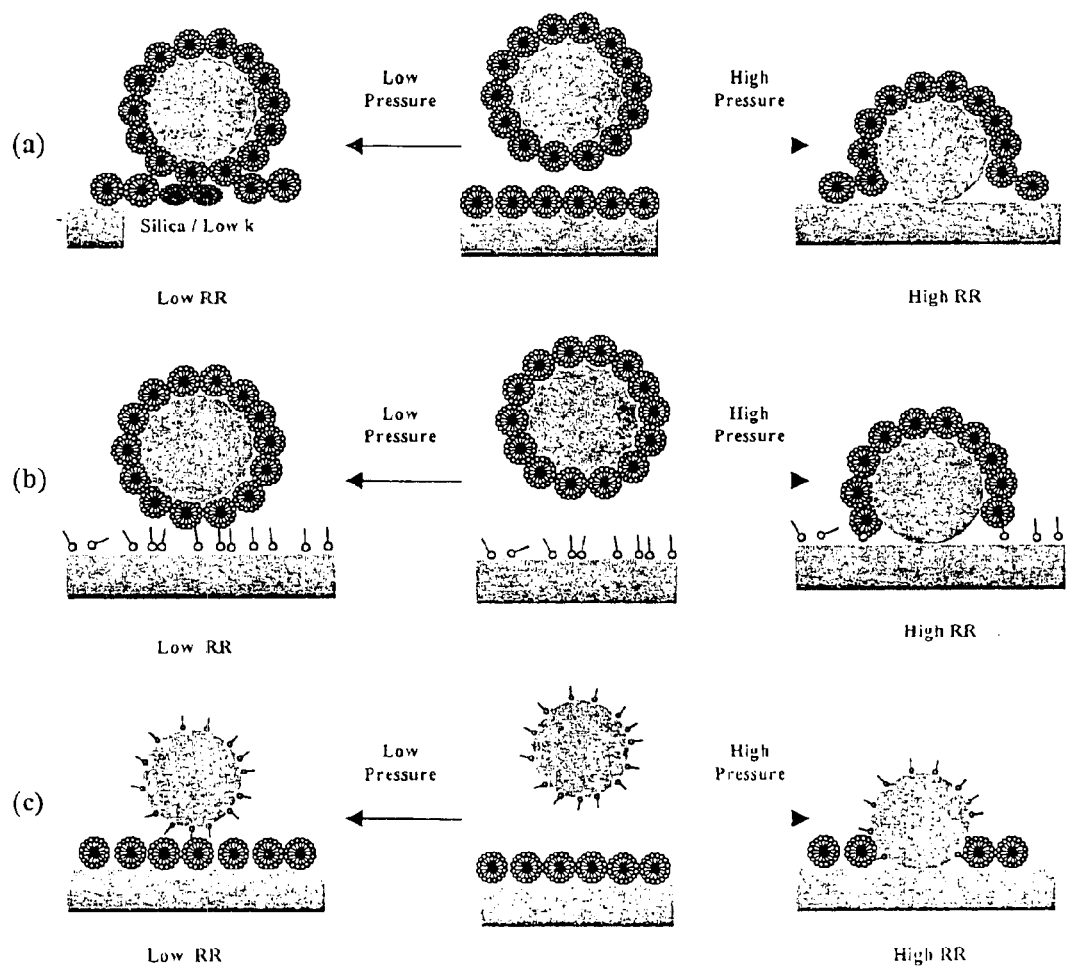
FIG. 11(a)–(c) illustrate schematic diagrams showing various structures of composite particles and the surface of dielectric films such to achieve pressure-dependent adsorption characteristics during CMP and CMS.

FIGS. 9–11 show non-substantial adsorption, substantial adsorption and pressure dependent adsorption, respectively. The degree of the additive adsorption and as well as its strength of adsorption generally determines whether non-substantial or substantial adsorption occurs.

In each of these FIGs, high pressure range refers to a pressure range at or above a predetermined pressure, such as from 7 to 20 Psi, while low pressure refers to pressure range below the predetermined pressure, such as between about 0 to 7 Psi.

FIGS. 9(a)–(d) illustrate schematic diagrams showing various structures of composite particles and the surface of dielectric films which achieve non-substantial adsorption. These configurations are well suited for CMP. When non-substantial adsorption occurs under all pressure conditions, the surface exhibit both planarization as well as fairly rapid removal rates.

FIGS. 10(a)–(c) illustrate schematic diagrams showing various structures of composite particles and the surface of dielectric films which achieve substantial adsorption. These configurations are well suited for CMS. When substantial adsorption occurs under all pressures, the surface is smoothened without significant removal of the surface material.

FIGS. 11(a)–(c) are schematic diagrams which show pressure dependent polymer/surfactant adsorption characteristics. The adsorption characteristics are such that at low pressures substantial adsorption occurs resulting in a low removal rate, while at high pressures non-substantial adsorption occurs resulting in a high removal rate. For example, improved polishing results can be achieved by providing substantial adsorption on the silicon dioxide or low K surface at some specific pressure low range (e.g., 0–7 Psi), but non-substantial adsorption at some pressure higher pressure range (e.g., 7–20 Psi). If this occurs, non-linear polishing characteristics are achieved. Thus, at low pad pressures the polishing rate is low, whereas at higher pad pressures the polishing rate is much higher.

This gives rise to a super-linear behavior of the polishing rate with pressure. This condition exists because at low polishing pressures the pad pressure is not high enough to remove the surfactant/polymer additive layer leading to low removal of material, whereas at high pressures, the pad pressure is sufficient to remove the surfactant/polymer additive from the surface, leading to rapid polishing of the silicon dioxide or low K layer surface. This removal rate as a function of pressure profile is especially advantageous for CMP as it provides improved planarity of the silicon dioxide or low K surface during the polishing process.

Figure 12:
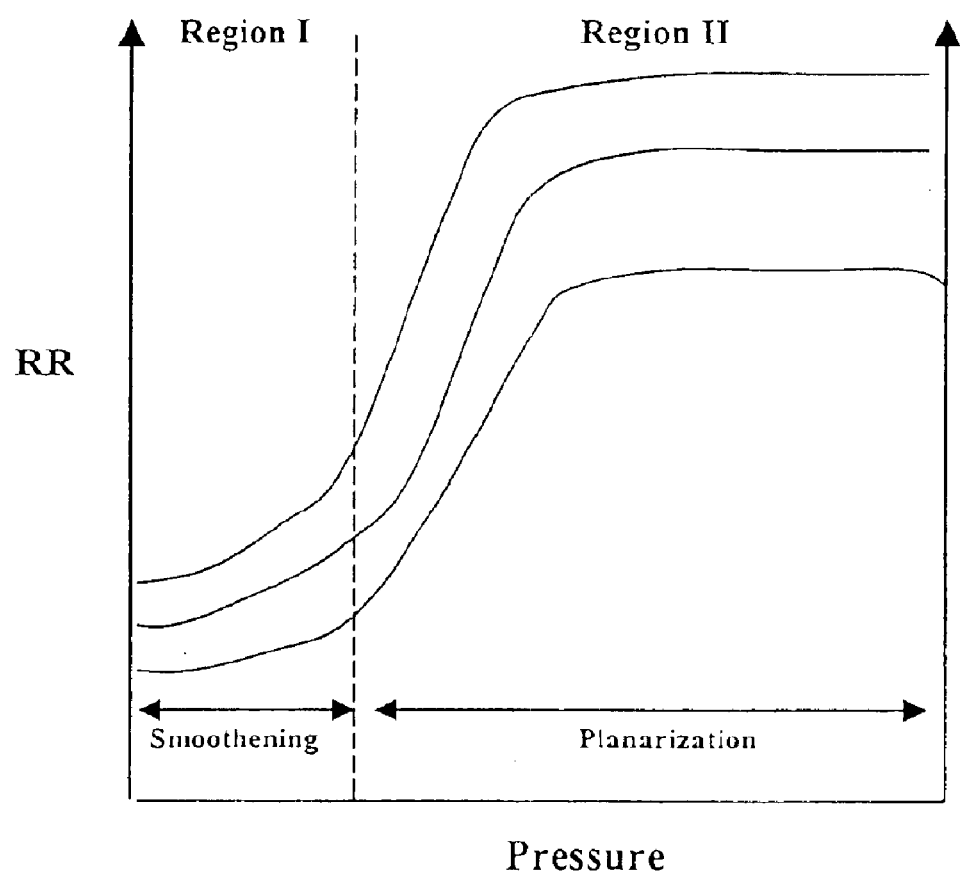
FIG. 12 is a schematic diagram showing non-linear polishing rates for a dielectric as a function of pressure. Region I corresponds to a region suitable for CMS, while Region II corresponds to a region suitable for CMP.

If pressure dependent polymer/surfactant adsorption characteristics are obtained, the removal rate of the dielectric as a function of pressure can be schematically shown in FIG. 12. At low pressures the removal rate is very low as compared to when no additives are present, while under high pressure conditions, the removal rate increases substantially, and is similar to having no additives in the slurry. This behavior is very different from conventional slurries used for dielectric polishing which typically exhibit a more linear-like behavior. The non-linear behavior can be modified by changing the size and concentration of the particles, concentration and composition of the additives and salts, pH or by changing the properties of the polishing pad.

FIG. 12 shows two (2) regions. Region I is useful for CMS where planarization takes place without substantial material removal (<500 Å/min). In Region II, planarization takes place with substantial removal of the material (>500 Å/min). Thus, by controlling the nominal pad pressure, the pad properties (e.g., modulus) and the slurry additives it is possible to operate in either of Region I (CMS) or Region II (CMP).

Chemical mechanical smoothening can also take place at any pressure (e.g., 0–50 Psi) if substantial adsorption occurs throughout the pressure range. Depending on the particular dielectric material(s) and the adsorption additive(s), the pressure range can vary. It is generally preferably to perform CMS at pad pressures slightly below the upper end of the pressure range in which substantial adsorption occurs. Smoothening occurs because the rough points in a surface exhibit much higher pressure points and can be selectively planarized by this method. This is shown for silicon nitride in FIG. 8, and for silicon dioxide or low K dielectrics in FIG. 10.

Figure 13:
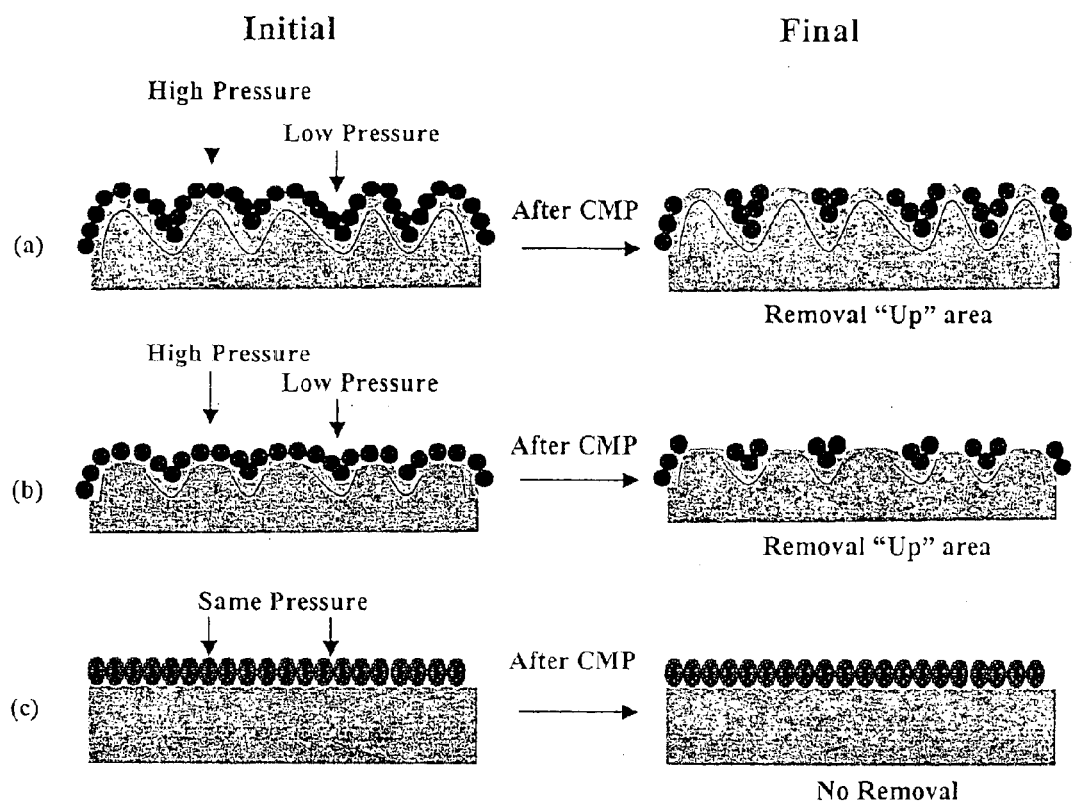
FIG. 13(a)–(c) are schematic diagrams showing automatic stopping of a CMP process after planarization of the surface.

The non-linear polishing behavior of the slurry can also provide a polishing process which permits auto stopping capability. This is shown schematically in FIG. 13(a)–(c). When the surface is non-planar, the top areas represent high pressure points, which will be removed at a rapid rate (FIG. 13(a)). The low areas represent reduced pressures, thus the removal rate will be relatively low. This will lead to smoothening of the surface (FIG. 13(b)). Once the surface-non-planarity is removed, the overall removal rate will drop to a very low value, as the average nominal pressure is not high enough to lead significant removal of the dielectric layer (FIG. 13(c)).

To quantify the adsorption and selective adsorption characteristics of surfactants or polymers additives, this application will define certain new terminology and related parameters in relation to new measurement techniques. Standard measurement techniques and measures of adsorption density of surfactants use solution depletion methods, contact angle or zeta potential or atomic force microscopy (AFM) methods. These conventional methods have been found to be inadequate to describe the effects of adsorption phenomena on resulting CMP characteristics. Some of the shortcomings of conventional measurement methods include the inability to conduct measurements in actual CMP conditions where interactive effects may play a critical role. Moreover, conventional methods produce results which generally lack correlation with the CMP polishing rate. As described below, new variables have been defined herein, such as adsorption ratios (AR) and selective adsorption ratios (SAR) to correspond to parameters obtained when using one or more adsorption additives.

The adsorption and the selective adsorption characteristics of surfactants and polymer additives on various surfaces when immersed in the slurry can be defined by the parameters adsorption ratio (AR) and selective adsorption ratio (SAR), respectively. The adsorption ratio of a material X is denoted as $AR_X$ and is defined as the CMP polish rate without surfactant or polymer additive divided by the CMP polish rate in presence of the surfactant or polymer additive. The AR is generally greater than or equal to 1, since the polishing rate of a given material can only generally decrease upon the addition of a surfactant or a polymer additive which exhibits surfactant-like properties. However, in cases where the surfactant destabilizes the slurry, the AR values can be less than 1.0. This condition is not desirable for CMP applications.

$AR_X(C)$=(CMP Polish Rate without additives)/(CMP Polish Rate with additives)

As used above, "C" corresponds to the concentration of the surfactant or polymer additive. The AR parameter also permits an objective definition of what constitutes substantial adsorption of an additive in relation to one or more layers. As noted earlier, "substantial adsorption" relative to a given layer refers to a CMP polishing rate (for given slurry and CMP polishing conditions) without the adsorption additive being at least four (4) times the CMP polishing rate in presence of the adsorption additive. In the case of strong adsorption of the adsorption additive, such as by the underlying dielectric layer (e.g., silicon nitride), AR values can be at least 4, preferably greater than 50, and even 500 or more in certain embodiments. This condition typically occurs when the adsorption additive provides significant adsorption to both the dielectric and the inorganic core particle. On the other hand, non-substantial adsorption relative to a given film refers to a CMP polishing rate (for a given slurry and CMP polishing conditions) without the selective adsorption additive being less than or equal to 4 (four) times the polishing rate of the layer with the adsorption additive.

AR values generally do not change linearly with concentration of the additives, but in a rather complicated manner. The complicated nature may be due to different phenomena which occur on the particle as well as the polishing surfaces, and as the concentration of the surfactants or polymer additives are varied. For example at low additive concentrations, AR value can decrease with addition of additives due to destabilization of particles in the slurry due to partial adsorption.

The AR ratios may increase rather suddenly with slight increase in concentration due to formation of micelles and fixation of micelles on the surface of solid surfaces, or a lubrication effect of the surfactants during polishing. In other cases, such, the change in AR is basically linear in nature signifying a linear like effect, such as a linear increase in surface coverage. The AR values can also be influenced by other additives which may be present in the solution, such as salts, co-ions, and counter ions, and changes in the pH of the system.

As the AR increases, a higher adsorption of the additive on the surface of the film or on the particle surface generally results. Simultaneously, the removal of the additive may be become more difficult. Besides the accompanying change in the CMP polishing rate, the AR ratio can also be used as a guide to determine other properties of the slurry. Generally, the higher the value of AR, the higher the stability of the slurry. Thus, particle contamination on the surface of a dielectric after CMP polishing can generally be kept at a minimum through the use of surfactant or polymer additives. The other salient aspects of particle defectivity including, scratches and dents, will also generally decrease with increasing AR values. In addition, the planarity of dielectric polish generally improves with increasing AR values, especially if they are pressure dependent. Besides enhancing the selectivity of the polish, higher AR values are expected to lead to other beneficial properties including slurry stability, reduced surface defectivity of the dielectric and enhanced planarity of polishing.

Another important property of the surfactant and polymer additives, for STI applications, is the selective adsorption it can provide. Selective adsorption ratios (SARs) compare the adsorption ratios of two dielectric materials, such as X and Y. The adsorption selectivity of material X compared to material Y denoted by $SAR_{X/Y}$ at a particular concentration "C" of the surfactant or polymer additive is defined as the value of $AR_X$ divided by the value of $AR_Y$:

$SAR_{X/Y}(C)=AR_X(C)/AR_Y(C)$

Both $AR_X$ (C) and $SAR_{X/Y}$ (C) are generally a function of the type and the concentration (C) of the surfactant or polymeric selective adsorption additive. The higher the SAR, the higher the selectivity of additive adsorption. If Y is a silicon dioxide, while X is silicon nitride containing layer, to achieve high $SAR_{SiN/silicon\ dioxide}$ values it is necessary to have high values of $AR_{SiN}$ and relatively low values of $AR_{silicon\ dioxide}$. Thus, the selective adsorption additive is preferably selectively adsorbed by the silicon nitride as compared to the silicon dioxide or low K dielectric layer to achieve high $SAR_{SiN/silicon\ dioxide}$ values. In experiments performed, $SAR_{SiN/silicon\ dioxide}$ was found to vary from about 0.3 to over 1,000. The $SAR_{SiN/silicon\ dioxide}$ may also be pressure dependent as the AR silicon dioxide values may be pressure dependent.

The selectivity of CMP polishing of material X (e.g silicon dioxide) divided by the CMP polish rate of material Y (e.g silicon nitride) at a concentration "C" of the surfactant or polymer additive is denoted herein as $S_{Silicon\ dioxide/SiN}$ (C), and can be expressed by the following equation:

$$S_{Silicon\ dioxide/SiN}(C) = SAR_{SiN/Silicon\ dioxide}(C) \times S_{silicon\ dioxide/SiN}(0)$$

where $S_{silicon\ dioxide/SiN}(0)$ is the ratio of the CMP polish rates of silicon dioxide and silicon nitride comprising layer when no polymeric or surfactant selective adsorption additives are added to the solution. This equation shows that to achieve high selectivity, the $S_{silicon\ dioxide/SiN}(0)$ values should be maximized.

Figure 14:
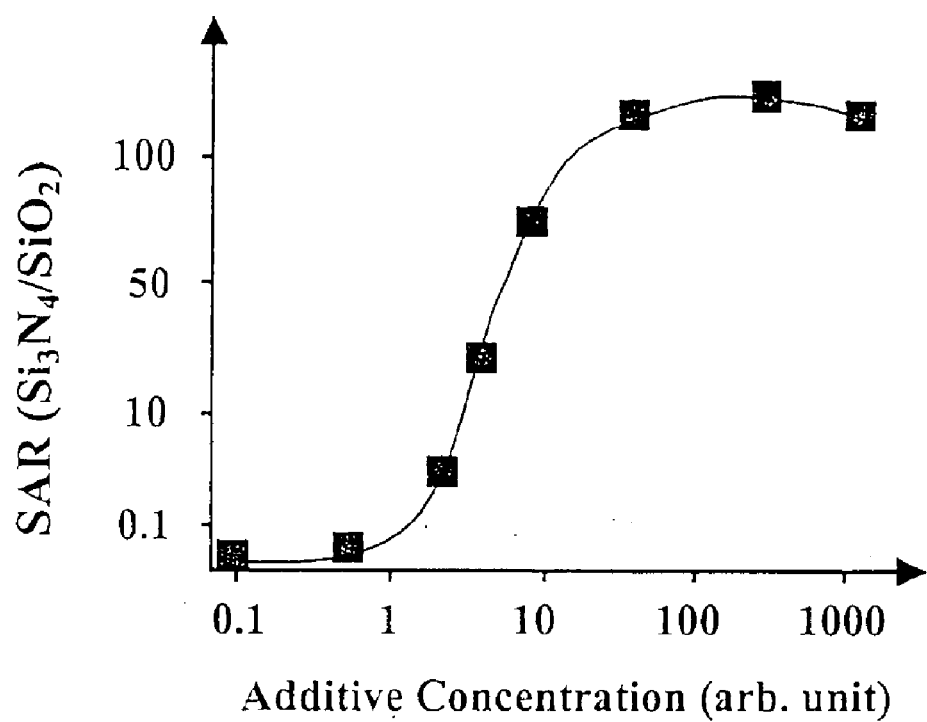
FIG. 14 is a schematic diagram showing the SAR of silicon dioxide to silicon nitride polishing as a function of the concentration of the additive.

As noted above, the SAR values depend on the composition and the concentration of the surfactant and polymer additives. Other additives such as salts, organic additives, co-ion and counter ion concentration, may also effects SAR values. FIG. 14 shows the SAR values for silicon nitride/silicon dioxide and as a function of additive concentration. At low additive concentration, low SAR values are observed, which increases to higher values when more than a specific concentration of the additives are provided. Surfactants or polymer additives are preferably selected to strongly adsorb to the core particles and the underlying silicon nitride dielectric layer, and weakly adsorb to the silicon dioxide layer to be polished. The surfactant/polymer additive preferably possesses a large AR value for the silicon nitride dielectric and low AR values for the silicon dioxide or low K dielectric layers.

Another feature which can be provided by the invention is a non-linear removal rate of the dielectric as a function of pad pressure. To describe linear and non-linear polishing behavior as a function of pressure, a new parameter is defined herein and referred to as normalized polishing to pressure ratio (NPPR) or NPPR ($P_1$, $P_2$) and is defined by:

$$NPPR(P_1, P_2) = (R_{P2} \times P_1)/(R_{P1} \times P_2)$$

where $R_{P1}$ and $R_{P2}$ are the removal rates for a given material at pressure $P_1$ and $P_2$, respectively. The pressure range generally used with the invention is typically between 1 to 15 Psi, which is the generally the range of pressures used in conventional CMP. A conventional silica based slurry for silicon dioxide or low K dielectric polishing exhibits a NPPR approximately between 0.5 to 1.0 within the pressure range of 1.5 Psi to about 15 Psi.

Examples for NPPR values in these pressure ranges can be found in numerous available references in the open literature. A value of 1 corresponds to a linear polish rate, which means that as the pressure is increased the polishing rate also increases linearly and at the same rate as pressure increase. This behavior has been predicted by Preston's equation, which is widely cited in the literature. A value substantially less than 1 indicates that pressure has very little effect on the polishing rate. A value less than 0.7 may indicate high non-planarity in the polishing process either due to etching, or slurry having a high chemical action. Conventional silica and ceria polishing slurries generally show a NPPR value of 1 or less.

To achieve NPPR values substantially greater than 1.0, pressure dependent adsorption characteristics of surfactants or polymer additives may be used. At low polishing pressures, the adsorbed surfactants are generally not removed from silicon dioxide or low K dielectric surfaces. As the pressure is increased, the surfactants are removed from the silicon dioxide or low K dielectric surfaces, leading to high removal rates. Thus, the slope of the polishing rate versus pressure curves are substantially increased leading to higher NPPR values. As the pressures are increased even further, the slope decreases because of the saturation or slurry starvation effects.

A NPPR value greater than 1 will generally lead to a higher surface planarity during the polishing process. A value of 1.20 or higher will generally indicate excellent planarity of the polishing process. In experiments performed described in the examples to follow it is shown that by using several surfactants and polymer additives, and their mixtures, the NPPR values for silicon dioxide or low K dielectrics can be greater than 1.2 in the pressure range of 1.5 to 7 Psi.

Slurries with NPPR values greater than 1.2 can be used to planarize silicon dioxide or low K dielectric films in high topographical regions without significant removal of silicon dioxide or low K dielectric in the lower regions. This is possible because at low pad pressure the removal rate is very low, whereas the high pressures the removal rate is much higher. By controlling the surfactant and polymer additives, particle size, type and concentration, and the pH and other additives, such as salt, co-ions, counter ions, and organic additives, the NPPR values can be controlled.

For example, the polishing rate increases as the size of the abrasive particles and as its concentration increases. Thus, by controlling the size and concentration of the abrasive particles NPPR values of greater than 1.3 can also be obtained for low K dielectric materials, such as, but not limited to carbon, fluorine and nitrogen doped silica, porous silica, polymer based dielectrics and silicon nitride containing materials. Values of NPPR greater than 1.3 have been obtained for low K dielectrics.

EXAMPLES

Example I

Substantial Adsorption Effect for Silicon Nitride

FIG. 15 is a table showing the removal rate of silicon nitride and its adsorption ratio (AR) when a single surfactant and a silicon nitride particle based slurry was used. The CMP experiments were conducted with silicon nitride based slurries at a pH of 3.0, a polishing pressure of 6.7 Psi, and a linear velocity of 253 ft/min. A bench-top Rotopol 30 polisher manufactured by Struer Company was used in this experiment. The concentration of the silicon nitride particles in the slurry was fixed at 2 wt percent. The particle size was varied from 80 nm to 2000 nm. FIG. 15 shows that the substantial adsorption effect can take place when cationic (CTAB), anionic (SDS), or zwitterionic (KETJENLUBE 522®/Dapral GE 202) surfactants are added to slurry.

The removal rate of the silicon nitride is substantially decreased by the addition of the surfactant, thus leading to a high adsorption ratio (AR). A high AR also leads to enhanced selectivity of silicon dioxide removal rate compared to silicon nitride. It was also determined that the adsorption ratio for silicon nitride is not generally affected when the linear velocity or polishing pressure was varied significantly from the experimental values used. The high adsorption ratios are also expected to result in smoothening of the silicon nitride surface without substantial removal of dielectric, such as silicon dioxide or a low K dielectric.

FIG. 16 shows the effect of different core particle including 50 nm and 500 nm silica particles, 100 nm nanoporous silica particles, 500 nm alumina coated with silica, 500 nm silica coated with cerium oxide, and 300 nm silica particles coated with manganese oxide, and titania films on the adsorption ratio effect on silicon nitride. A single surfactant (SDS) was added to each slurry with concentrations varying from 5 mM to 128 mM. The polishing experiments were conducted at a pH of 3 with particles constituting 2 weight of the slurry. In all cases substantial adsorption was observed with the adsorption ratio varying from approximately 15 to approximately 50. This clearly shows that the additives on various particles can be used to modulate the removal rate of silicon nitride.

FIG. 17 shows the effect of pH on the AR ratio of silicon nitride when polished with 80 nm silicon nitride particles. The polishing pressure was 6.7 Psi, and a linear polishing velocity of 253 ft/min was used. The polishing studies were conducted using silicon nitride particles and 32 mM of KETJENLUBE 522® (Dapral GE 202) as an additive. The results show that the adsorption ratio for silicon nitride is greater than 30 in all cases for all pH conditions used. The high AR for silicon nitride leads to reduced removal rate of silicon nitride during STI polishing.

Similar high adsorption ratios are observed when a mixture of surfactants and polymeric additives are used. A mixture may include one or more surfactants from within the same group (cationic, non-ionic, zwitterionic, anionic), and/or surfactants mixed among different groups. FIG. 18 shows results obtained using mixtures of surfactants and polymer additives to achieve substantial adsorption ratios with respect to silicon nitride. The pH was fixed at 3.0, the polishing pressure was 6.7 Psi and the linear polishing velocity was 253 ft/sec. Different combinations of surfactants and polymer additives were used as shown in FIG. 18. In this example, the concentrations of each of the additives were varied from 1% to 95% by weight. Salts such as ammonium nitrate or polymeric additives such as PEO and PAA were added to these surfactant mixtures. FIG. 18 clearly shows that by using a mixture of surfactants and polymer additives, substantial adsorption (AR values greater than about 40) on silicon nitride can be obtained.

The surfactants described herein are only a representative of the surfactants that can be used to achieve substantial adsorption effect in silicon nitride. A more detailed list of the surfactants can be obtained from Mukherjee.

Example II

Substantial and Non-Substantial Adsorption, and Pressure Dependent Adsorption on Silicon Dioxide Besides substantial adsorption onto silicon nitride, one preferred embodiment of the invention relates to creating substantial and non-substantial adsorption on silicon dioxide surfaces by addition of specific additives such as surfactants, soluble polymers and salts. Additionally, pressure dependent adsorption effects have also been demonstrated.

FIG. 19 shows the adsorption ratio on silicon dioxide and carbon doped silica based low K materials using a slurry including CTAB based surfactant additives and various particles. The pH of the slurry was adjusted to 7.0 and the concentration of the particles was varied from 2 to 5 wt. %. The polishing pressure was 6.7 Psi while the linear velocity was 253 ft/sec. Single phase inorganic cores (silicon nitride, silica, and nanoporous silica) and coated inorganic cores (silica coated with ceria, titania, manganese oxide, and alumina coated with silica) were used in this example. The concentration of the surfactant used varied from 64 mM to 100 mM. The results show that by controlling additives "substantial adsorption" is observed for silicon dioxide and related low K dielectrics with AR values in the range from about 30 to 70.

Substantial adsorption and non substantial adsorption effects can also be observed for silicon dioxide if mixed surfactants or polymeric additives are used. FIG. 20 shows the adsorption ratios for silica and carbon doped silica low K material when slurries consisting of silica and silicon nitride are used. The additives used in this example represent a mixture of surfactants and polymeric additives. The concentration of the additives was kept at two values (5 mM and 128 mM), while the ratios of mixtures were varied from 5% to 95%. The pH was maintained at 3.0. Non-substantial adsorption values were observed when low concentration of additives (5 mM) were used, while high adsorption ratios for silicon dioxide was observed when a high additive concentration (128 mM) was used.

FIG. 21 shows the adsorption ratio on silicon dioxide using CTAB based additives at a pH varying from 2 to 13. A polishing pressure of 6.7 Psi and the linear polishing velocity of 250 ft/sec were used for the experiments. $C_{12}$TAB with 12 carbon chains was used in the experiment. However, it should be noted that other carbon chain length surfactants can be used. The concentration of the surfactant will generally depend on the number of carbon chains n the surfactant. FIG. 21 shows high AR values are obtained for both silicon dioxide and low K dielectric for a wide range of pH when the concentration of the surfactant was high. At low concentrations of the surfactant, non-substantial adsorption is generally observed.

By controlling the surfactant/polymer and salt additive mixture, and/or the pressure during polishing, the AR values for silicon dioxide and low K materials can be modified. FIG. 22 shows the adsorption ratios of silicon dioxide when various particle (silica, nanoporous silica) based slurries were used. The concentration of particles was kept at 2% by weight and the polishing pressures was varied from 2.0 Psi to 12.8 Psi. The mixture of surfactants included cationic, non ionic and anionic surfactants. The concentration of surfactants was kept at 128 mM, while a pH of 3 was maintained. The composition of the surfactant in the mixture was varied from 5% to 95%. FIG. 22 shows that both substantial and non substantial adsorption on silicon dioxide can be obtained by varying the pressure or the composition of the surfactants. Pressure dependent substantial and non-substantial adsorption can generally be achieved by choosing surfactants, polymer additives and salts from a large group of additives as described earlier. The surfactants described herein are only a representative of the surfactants that can provide substantial adsorption and pressure dependent adsorption for silicon dioxide. A more detailed list of the surfactants is provided by Mukherjee.

Example III

Selective Adsorption Ratio and Selectivity

By controlling the adsorption ratio for both silicon nitride and silicon dioxide or low K dielectric surfaces, the selective adsorption ratio and the selectivity for polishing silicon dioxide or low K dielectrics with respect to silicon nitride can be controlled. FIG. 23 shows SAR and selectivity values for silicon nitride/silicon dioxide polishing using single and mixed selective adsorption additives. The pH of the slurry in these experiments was kept at 3, while the polishing pressure and the linear velocity were maintained at 6.7 Psi and 250 ft/min, respectively. The particle loading was maintained at 2 weight percent. The concentration of each of the surfactants, polymer additives and salts were varied from 0.1 mM to 128 mM, while the total concentration of surfactant species was 130 mM. The result shows that high SAR values can be obtained using single or a mixture of surfactants/polymer additives and salts.

The SAR values are also generally dependent on the pH of the slurry. FIG. 24 shows SAR values when SDS was used as an additive. The slurry included 2 weight % silicon nitride particles with the pH varying from 2 to 11. A nominal pressure of 6.7 Psi and linear velocity of 253 ft/min was used in the experiments. FIG. 24 shows high nitride to oxide selectivity values can be obtained under a wide range of pH conditions.

Example IV

Normalized Polishing Rate to Pressure Ratio (NPPR)

Slurries with various additives can be used to achieve non-Prestonian polishing behavior. A super-linear polishing rate corresponds to NPPR values greater than 1.0. Typical stable conventional slurries for polishing silicon dioxide and low K dielectrics achieve NPPR values close to 1.0 (Prestonian). FIG. 25 lists the NPPR values between upper and lower pressure ranges for silicon dioxide polishing using slurries with various additives.

The experiments were conducted at a pH of 3.0. Alumina, silicon nitride and silica particles were used in the experiments. The pressure was varied from 2.7 Psi to 14.0 Psi, while the additives were varied from single component surfactants to mixtures of surfactants, polymer additives and salts. The concentration of the surfactants and polymer additives was fixed at 128 mM). FIG. 25 demonstrates that by varying the core particles and the additives in the mixture, the NPPR values can be varied from 1.2 to nearly 3.0. As noted earlier, NPPR values greater than about 1.2 produces highly planar polishing characteristics. Experiments performed using lower pressures (e.g. 2.7 Psi) also demonstrated NPPR values greater than 1.2.

Example V

Example of Chemical Mechanical Smoothening (CMS)

Figure 26:
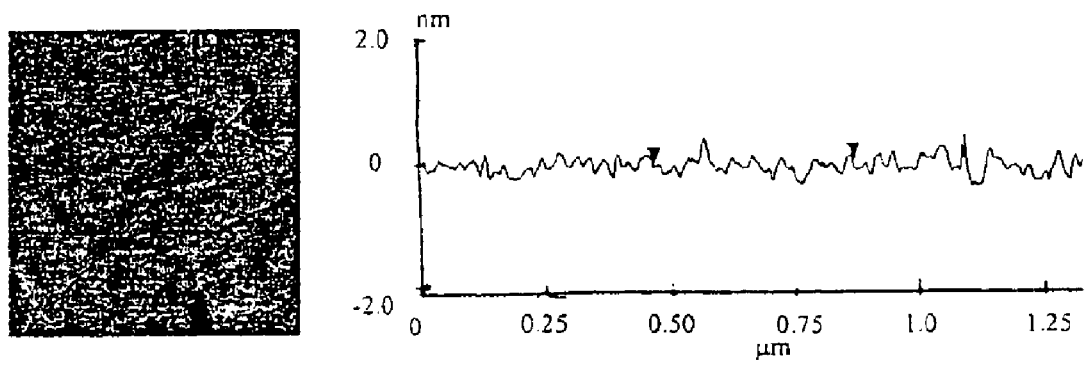
FIG. 26 shows an AFM and line scan of a smoothened silicon nitride when polished under substantial adsorption conditions.

Additive based slurries can be used to smoothen dielectric surfaces, such as silicon dioxide or low K dielectrics, or silicon nitride without substantial removal of the dielectric material. FIG. 26 shows an AFM micrograph of the surface of silicon nitride after a CMS process using a slurry including SDS at a pH 7.0 was performed. The concentration of SDS was 64 mM, while the polishing was performed using a 1% concentration of 80 nm silicon nitride particles. The planarization was conducted at 6.7 Psi and with a linear velocity of 253 ft/min. The micrograph shows that the rms roughness of silicon dioxide is approximately 1 Å, with high points on the surface completely removed. The difference in the height is less than 1 Å across the surface shown.

Example VI

Examples of Planarization of Metal-Dielectric Structure

A film of tantalum (or tantalum nitride) on top of a silicon dioxide layer was polished with a slurry containing 5 weight percent of 20 nm silicon dioxide particles. 20 mM of benzotriazole solution and 5 CMC CTAB and 30 mM of Dapral GE 202 was added to the slurry. The slurry pH was 3.0. The polishing pressure was 4.0 Psi. The polishing rate of tantalum was approximately 50 nm/min while the removal rate of silicon dioxide was also 50 nm per minute. A NPPR value of 1.2 was obtained for silicon dioxide in a pressure range of from 6.7 to 12.0 Psi.

It is to be understood that while the invention has been described in conjunction with the preferred specific embodiments thereof, that the foregoing description as well as the examples which follow are intended to illustrate and not limit the scope of the invention. Other aspects, advantages and modifications within the scope of the invention will be apparent to those skilled in the art to which the invention pertains.

I claim:

1. A slurry for chemical mechanical polishing (CMP) comprising:
   a. bulk solution;
   b. plurality of particles, and
   at least one selective adsorption additive in a concentration of from 6 to 1,000 critical micelle concentration (CMC) when said selective adsorption additive is non-ionic and from 1 to 1,000 CMC when said selective adsorption additive is zwitterionic, anionic or cationic, wherein said selective adsorption additive self assembles in said bulk solution.

2. The slurry of claim 1, wherein said selective adsorption additive comprises at least one cationic, anionic or zwitterionic surfactant, wherein a minimum concentration of said surfactant is 3 CMC.

3. The slurry of claim 1, said selective adsorption additive comprises a mixture of at least one anionic surfactant and at least one cationic or zwitterionic surfactant.

4. The slurry of claim 1, where said selective adsorption additive comprises at least one cationic, anionic or zwitterionic surfactant, wherein a minimum concentration of said surfactant is 6 CMC.

5. The slurry of claim 1, wherein said selective adsorption additive comprises at least one cationic, anionic or zwitterionic surfactant, wherein a minimum concentration of said surfactant is 10 CMC.

6. The slurry of claim 1, wherein said selective adsorption additive comprises a mixture of surfactants, said surfactants including at least one surfactant from at least two of the groups consisting of anionic, cationic, zwitterionic and non-ionic surfactants.

7. The slurry of claim 1, wherein said selective adsorption additive comprises at least one cationic, anionic or zwitterionic surfactant, wherein a minimum concentration of said surfactant is 20 CMC.

8. The slurry of claim 1, wherein said plurality of particles comprise nanoporous particles.

9. The slurry of claim 1, wherein said plurality of particles are multiphase particles comprising a first material coated with a second material, said second material different from said first material.

10. The slurry of claim 1, wherein a CMP process using said slurry provides a normalized polishing rate to pressure ratio (NPPR) value for polishing a silicon dioxide or a low K dielectric layer of at least 1.2 for a CMP polishing process.

11. The slurry of claim 10, wherein said CMP process is performed in a pressure range selected from the group consisting of from 1.5 to 6.5 Psi, 3.0 to 9.0 Psi, 4.5 to 15 Psi, and 5.7 to 16.0 Psi.

12. The slurry of claim 1, wherein said slurry provides an adsorption ratio (AR) of at least 4.0 for a silicon nitride containing film and no more than 4.0 for a silicon dioxide or a low K dielectric film.

13. The slurry of claim 1, wherein a CMP process using said slurry provides a selectivity of at least 50 for polishing a silicon dioxide or a low K dielectric film relative to a silicon nitride containing film for a CMP process run under acidic pH conditions.

14. A slurry for chemical mechanical polishing (CMP) a structure including a silicon dioxide or a low K dielectric film and a silicon nitride containing film, comprising:
   a bulk solution;
   a plurality of particles,
   at least one selective adsorption additive in a concentration of at from 6 to 1,000 critical micelle concentration (CMC) when said selective adsorption additive is non-ionic and from 1 to 1,000 CMC when said selective adsorption additive is zwitterionic, anionic or cationic, said concentration sufficient for self assembly of said selective adsorption additive in said bulk solution, wherein said slurry provides non-substantial adsorption of said selective adsorption additive for said silicon dioxide or said low K dielectric film in a CMP process at a pressure above a predetermined first pressure, and substantial adsorption of said selective adsorption additive at a pressure below a predetermined second pressure, wherein said first pressure is greater than said second pressure.

15. The slurry of claim 14, wherein said first pressure is at least 5 Psi.

16. The slurry of claim 14, wherein said first pressure is at least 3.5 Psi and said second pressure is no more than 3.0 Psi.

17. The slurry of claim 14, wherein said selective adsorption additive is substantially adsorbed by said silicon nitride containing film.

18. The slurry of claim 14, wherein an AR for said silicon dioxide or said low K film is above 3.0 for a pressure below 3 Psi and said AR is below 2.5 for pad pressures above 8 Psi.

19. The slurry of claim 14, wherein said selective adsorption additive comprises at least different two surfactants.

20. The slurry or claim 14, wherein said selective adsorption additive is a cationic, anionic or zwitterionic surfactant, wherein a minimum concentration of said surfactant is 3 CMC.

21. The slurry of claim 14, wherein said selective adsorption additive is a cationic, anionic or zwitterionic surfactant, wherein a minimum concentration of said surfactant is 6 CMC.

22. The slurry of claim 14, wherein said selective adsorption additive is a cationic, anionic or zwitterionic surfactant, wherein a minimum concentration of said surfactant is 10 CMC.

23. A slurry for chemical mechanical polishing (CMP) of a dielectric film or a embedded metallic structure in a dielectric film, comprising:
   a bulk solution;
   a plurality of particles, and
   at least one selective adsorption additive in a concentration of at from 6 to 1,000 critical micelle concentration (CMC) when said selective adsorption additive is non-ionic and from 1 to 1,000 CMC when said selective adsorption additive is zwitterionic, anionic or cationic, said concentration sufficient for self assembly of said selective adsorption additive in said bulk solution, wherein said adsorption additive is substantially adsorbed by said dielectric film only when a pad pressure is below a predetermined value.

24. The slurry of claim 23, where said dielectric comprises at least one selected from the group consisting of silicon dioxide, low K dielectrics, silicon nitride and alumina.

25. The slurry of claim 23, wherein said adsorption additive comprises a cationic, anionic or zwitterionic surfactant, wherein a minimum concentration of said surfactant is 3 CMC dielectric film is an underlying layer below a metal layer, said metal layer selected from the group consisting of Ta, TaN, W, WN, TiN, Cu, Al, Ag, and alloys thereof.

26. The slurry of claim 23, wherein said predetermined value is from 0 to 7 Psi, from 0 to 15 Psi, from 3 to 4 Psi, or from 3 to 6 Psi.

27. The slurry of claim 23, wherein said adsorption additive comprises a cationic, anionic or zwitterionic surfactant, wherein a minimum concentration of said surfactant is 6 CMC.

28. The slurry of claim 23, wherein said adsorption additive comprises a mixture of at least one anionic surfactant and at least one cationic surfactant.

29. The slurry of claim 23, where said adsorption additive comprises a cationic, anionic or zwitterionic surfactant, wherein a minimum concentration of said surfactant is 10 CMC.

30. The slurry of claim 23, said plurality of particles comprise nanoporous particles.

31. The slurry of claim 23, wherein said selective adsorption additive comprises a mixture of surfactants, said surfactants including at least one surfactant from at least two of the groups consisting of anionic, cationic, zwitterionic and non-ionic surfactants.

32. The slurry of claim 23, wherein said plurality of particles are multiphase particles comprising a first material coated with a second material, said second material different from said first material said.

33. A slurry for chemical mechanical smoothening (CMS) a structure including a dielectric film or a metal structure embedded in a dielectric film, comprising:
   a bulk solution;
   at least one adsorption additive in a concentration from 6 to 1,000 critical micelle concentration (CMC) when said selective adsorption additive is non-ionic and from 1 to 1,000 CMC what said selective adsorption additive is zwitterionic, anionic or cationic, said concentration sufficient for self assembly of said selective adsorption additive in said bulk solution, and
   a plurality of composite particles, said composite particles including an abrasive core and a soft shell comprising said adsorption additive, wherein said adsorption additive is substantially adsorbed by said dielectric film.

34. The slurry of claim 33, wherein said selective adsorption additive comprises at least one cationic, anionic or zwitterionic surfactant, wherein a minimum concentration of said surfactant is 3 CMC.

35. The slurry of claim 33, wherein said selective adsorption additive comprises at least one cationic, anionic or zwitterionic surfactant, wherein a minimum concentration of said surfactant is 6 CMC.

36. The slurry of claim 33, wherein said adsorption additive provides pressure dependent adsorption, wherein said adsorption additive provides a normalized polishing rate to pressure ratio (NPPR) of at least 1.2 for said dielectric.

37. The slurry of claim 36, wherein said abrasive cores comprise nanoporous particles.

38. The slurry of claim 33, wherein said abrasive cores comprise a first material coated with a second material, said second material different from said first material.

39. A slurry for CMP of a structure including a silicon dioxide or low K dielectric layer over a silicon nitride layer, comprising:
- a bulk solution; and
- a mixture of additives including at least one selective adsorption additive or one soluble polymer additive in a concentration from 6 to 1,000 critical micelle concentration (CMC) when said selective adsorption additive is non-ionic and from 1 to 1,000 CMC when said selective adsorption additive is zwitterionic, anionic or cationic, said concentration sufficient for self assembly of said selective adsorption additive in said bulk solution, wherein a CMP process using said slurry provides a NPPR value of at least 1.3 in a predetermined pressure range.

40. The slurry of claim 39, wherein said predetermined pressure range is from 2 to 6 Psi, from 3 to 9 Psi, from 4 to 12 Psi, or from 5.5 to 17.0.

41. The slurry of claim 39 wherein a CMP process using said slurry provides a selectivity of at least 30 for said silicon nitride layer to said silicon dioxide or said low K dielectric layer.

42. The slurry of claim 39, further comprising a plurality of nanoporous particles or multiphase particles, said multiphase particles comprising a first material coated with a second material, said second material different from said first material.

* * * * *